(12) United States Patent
Yamazaki

(10) Patent No.: US 9,129,997 B2
(45) Date of Patent: Sep. 8, 2015

(54) SEMICONDUCTOR DEVICE AND METHOD FOR MANUFACTURING THE SAME

(71) Applicant: Semiconductor Energy Laboratory Co., Ltd., Atsugi-shi, Kanagawa-ken (JP)

(72) Inventor: Shunpei Yamazaki, Setagaya (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/337,599

(22) Filed: Jul. 22, 2014

(65) Prior Publication Data

US 2014/0335652 A1 Nov. 13, 2014

Related U.S. Application Data

(62) Division of application No. 13/330,778, filed on Dec. 20, 2011, now Pat. No. 8,829,512.

(30) Foreign Application Priority Data

Dec. 28, 2010 (JP) ................................. 2010-292404

(51) Int. Cl.
*H01L 29/66* (2006.01)
*H01L 29/786* (2006.01)
(Continued)

(52) U.S. Cl.
CPC ........ *H01L 29/66969* (2013.01); *H01L 27/127* (2013.01); *H01L 29/247* (2013.01);
(Continued)

(58) Field of Classification Search
CPC ................... H01L 29/66742; H01L 29/78618; H01L 29/7869; H01L 29/247; H01L 29/66969; H01L 27/127; H01L 29/78693

USPC .......... 257/43, 57, 16, E29.068, E21.409, 22, 257/24; 438/85, 86, 104, 754
See application file for complete search history.

(56) References Cited

U.S. PATENT DOCUMENTS 5,528,032 A 6/1996 Uchiyama
5,731,856 A 3/1998 Kim et al.
(Continued)

FOREIGN PATENT DOCUMENTS

EP 1209748 A 5/2002
EP 1443130 A 8/2004
(Continued)

OTHER PUBLICATIONS

Coates.D et al., Optical Studies of the Amorphous Liquid-Cholesteric Liquid Crystal Transition:The "Blue Phase", Physics Letters, Sep. 10, 1973, vol. 45A, No. 2, pp. 115-116.
(Continued)

*Primary Examiner* — Thinh T Nguyen
(74) *Attorney, Agent, or Firm* — Eric J. Robinson; Robinson Intellectual Property Law Office, P.C.

(57) ABSTRACT

A miniaturized semiconductor device including a transistor in which a channel formation region is formed using an oxide semiconductor film and variation in electric characteristics due to a short-channel effect is suppressed is provided. In addition, a semiconductor device whose on-state current is improved is provided. A semiconductor device is provided with an oxide semiconductor film including a pair of second oxide semiconductor regions which are amorphous regions and a first oxide semiconductor region located between the pair of second oxide semiconductor regions, a gate insulating film, and a gate electrode provided over the first oxide semiconductor region with the gate insulating film interposed therebetween. Hydrogen or a rare gas is added to the second oxide semiconductor regions.

18 Claims, 14 Drawing Sheets

(51) Int. Cl.
*H01L 27/12* (2006.01)
*H01L 29/24* (2006.01)
*H01L 21/02* (2006.01)

(52) U.S. Cl.
CPC ...... *H01L29/66742* (2013.01); *H01L 29/7869* (2013.01); *H01L 29/78618* (2013.01); *H01L 29/78693* (2013.01); H01L 21/02472 (2013.01); H01L 21/02488 (2013.01); H01L 21/02502 (2013.01)

(56) References Cited

U.S. PATENT DOCUMENTS

| | | | |
|---|---|---|---|
| 5,744,864 | A | 4/1998 | Cillessen et al. |
| 5,817,548 | A | 10/1998 | Noguchi et al. |
| 5,943,593 | A | 8/1999 | Noguchi et al. |
| 6,087,679 | A | 7/2000 | Yamazaki et al. |
| 6,294,274 | B1 | 9/2001 | Kawazoe et al. |
| 6,563,174 | B2 | 5/2003 | Kawasaki et al. |
| 6,727,522 | B1 * | 4/2004 | Kawasaki et al. ............ 257/103 |
| 6,878,962 | B1 * | 4/2005 | Kawasaki et al. ............ 257/43 |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,205,640 | B2 | 4/2007 | Yoshioka et al. |
| 7,211,825 | B2 | 5/2007 | Shih et al |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 * | 8/2008 | Endo et al. ............ 257/43 |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,511,343 | B2 | 3/2009 | Li et al. |
| 7,598,520 | B2 | 10/2009 | Hirao et al. |
| 7,674,650 | B2 | 3/2010 | Akimoto et al. |
| 7,732,819 | B2 | 6/2010 | Akimoto et al. |
| 7,935,964 | B2 | 5/2011 | Kim et al. |
| 7,993,964 | B2 | 8/2011 | Hirao et al. |
| 7,998,372 | B2 | 8/2011 | Yano et al. |
| 8,003,981 | B2 | 8/2011 | Iwasaki et al. |
| 8,093,589 | B2 | 1/2012 | Sugihara et al. |
| 8,158,976 | B2 | 4/2012 | Son et al. |
| 8,168,544 | B2 | 5/2012 | Chang |
| 8,207,756 | B2 | 6/2012 | Shionoiri et al. |
| 8,236,635 | B2 | 8/2012 | Suzawa et al. |
| 8,242,494 | B2 | 8/2012 | Suzawa et al. |
| 8,269,218 | B2 | 9/2012 | Yamazaki |
| 8,304,765 | B2 | 11/2012 | Yamazaki et al. |
| 8,309,961 | B2 | 11/2012 | Yamazaki et al. |
| 8,314,032 | B2 | 11/2012 | Kawamura et al. |
| 8,343,799 | B2 | 1/2013 | Ito et al. |
| 8,384,076 | B2 | 2/2013 | Park et al. |
| 8,395,931 | B2 | 3/2013 | Yamazaki et al. |
| 8,399,882 | B2 * | 3/2013 | Jeon et al. ............ 257/43 |
| 8,445,902 | B2 | 5/2013 | Sato et al. |
| 8,481,377 | B2 | 7/2013 | Akimoto et al. |
| 8,513,661 | B2 | 8/2013 | Takahashi et al. |
| 8,530,273 | B2 | 9/2013 | Boer |
| 8,618,537 | B2 | 12/2013 | Kaneko et al. |
| 8,624,240 | B2 | 1/2014 | Sato et al. |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager, III et al. |
| 2004/0023432 | A1 * | 2/2004 | Haga ............ 438/104 |
| 2004/0038446 | A1 | 2/2004 | Takeda et al. |
| 2004/0127038 | A1 | 7/2004 | Carcia et al. |
| 2004/0227150 | A1 | 11/2004 | Nakahara |
| 2005/0017302 | A1 | 1/2005 | Hoffman |
| 2005/0039670 | A1 | 2/2005 | Hosono et al. |
| 2005/0173734 | A1 | 8/2005 | Yoshioka et al. |
| 2005/0199959 | A1 | 9/2005 | Chiang et al. |
| 2006/0035452 | A1 | 2/2006 | Carcia et al. |
| 2006/0038242 | A1 | 2/2006 | Hsu et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0214008 | A1 | 9/2006 | Asami et al. |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0278490 | A1 | 12/2007 | Hirao et al. |
| 2007/0287221 | A1 | 12/2007 | Ong et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0116500 | A1 | 5/2008 | Tokunaga |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0277656 | A1 | 11/2008 | Park et al. |
| 2008/0296568 | A1 | 12/2008 | Ryu et al. |
| 2008/0315200 | A1 | 12/2008 | Kim et al. |
| 2009/0008638 | A1 | 1/2009 | Kang et al. |
| 2009/0008639 | A1 | 1/2009 | Akimoto et al. |
| 2009/0008645 | A1 | 1/2009 | Yamazaki et al. |
| 2009/0065771 | A1 * | 3/2009 | Iwasaki et al. ............ 257/43 |
| 2009/0068773 | A1 | 3/2009 | Lai et al. |
| 2009/0073325 | A1 | 3/2009 | Kuwabara et al. |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0278122 | A1 | 11/2009 | Hosono et al. |
| 2009/0280600 | A1 | 11/2009 | Hosono et al. |
| 2009/0283763 | A1 | 11/2009 | Park et al. |
| 2010/0051949 | A1 | 3/2010 | Yamazaki et al. |
| 2010/0065839 | A1 | 3/2010 | Yamazaki et al. |

(56) References Cited

U.S. PATENT DOCUMENTS

| | | |
|---|---|---|
| 2010/0065840 A1 | 3/2010 | Yamazaki et al. |
| 2010/0065844 A1 | 3/2010 | Tokunaga |
| 2010/0072467 A1 | 3/2010 | Yamazaki et al. |
| 2010/0084650 A1 | 4/2010 | Yamazaki et al. |
| 2010/0084655 A1 | 4/2010 | Iwasaki et al. |
| 2010/0092800 A1 | 4/2010 | Itagaki et al. |
| 2010/0102312 A1 | 4/2010 | Yamazaki et al. |
| 2010/0105163 A1 | 4/2010 | Ito et al. |
| 2010/0109002 A1 | 5/2010 | Itagaki et al. |
| 2010/0117073 A1 | 5/2010 | Yamazaki et al. |
| 2010/0117075 A1 | 5/2010 | Akimoto et al. |
| 2010/0123136 A1 | 5/2010 | Lee et al. |
| 2010/0155721 A1 | 6/2010 | Lee et al. |
| 2010/0159639 A1 | 6/2010 | Sakata |
| 2010/0224871 A1 | 9/2010 | Yamaguchi et al. |
| 2010/0301329 A1 | 12/2010 | Asano et al. |
| 2011/0062433 A1 | 3/2011 | Yamazaki |
| 2011/0062436 A1 | 3/2011 | Yamazaki et al. |
| 2011/0084263 A1 | 4/2011 | Yamazaki et al. |
| 2011/0095288 A1 | 4/2011 | Morosawa et al. |
| 2011/0109351 A1 | 5/2011 | Yamazaki et al. |
| 2011/0117698 A1 | 5/2011 | Suzawa et al. |
| 2011/0133181 A1 | 6/2011 | Yamazaki |
| 2011/0147738 A1 | 6/2011 | Yamazaki et al. |
| 2011/0156024 A1 | 6/2011 | Koyama et al. |
| 2011/0168993 A1* | 7/2011 | Jeon et al. ............ 257/43 |
| 2011/0175090 A1 | 7/2011 | Sugihara et al. |
| 2011/0182110 A1 | 7/2011 | Yamazaki et al. |
| 2011/0204362 A1 | 8/2011 | Akimoto et al. |
| 2012/0001167 A1 | 1/2012 | Morosawa |
| 2012/0161121 A1 | 6/2012 | Yamazaki |
| 2012/0161122 A1 | 6/2012 | Yamazaki |
| 2012/0161124 A1 | 6/2012 | Yamazaki |
| 2012/0161125 A1 | 6/2012 | Yamazaki |
| 2012/0161126 A1 | 6/2012 | Yamazaki |
| 2012/0242627 A1 | 9/2012 | Kim et al. |
| 2012/0319118 A1 | 12/2012 | Yamazaki |
| 2013/0037793 A1 | 2/2013 | Pan et al. |
| 2013/0127694 A1 | 5/2013 | Kim et al. |
| 2013/0309808 A1 | 11/2013 | Zhang et al. |

FOREIGN PATENT DOCUMENTS

| | | |
|---|---|---|
| EP | 1737044 A | 12/2006 |
| EP | 2120267 A | 11/2009 |
| EP | 2175493 A | 4/2010 |
| EP | 2226847 A | 9/2010 |
| EP | 2408011 A | 1/2012 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 06-275697 A | 9/1994 |
| JP | 08-264794 A | 10/1996 |
| JP | 09-139506 A | 5/1997 |
| JP | 11-505377 | 5/1999 |
| JP | 2000-026119 A | 1/2000 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-050405 A | 2/2003 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2005-033172 A | 2/2005 |
| JP | 2007-096055 A | 4/2007 |
| JP | 2007-123861 A | 5/2007 |
| JP | 2007-220816 A | 8/2007 |
| JP | 2008-147640 A | 6/2008 |
| JP | 2008-172244 A | 7/2008 |
| JP | 2008-277665 A | 11/2008 |
| JP | 2009-528670 | 8/2009 |
| JP | 2009-278115 A | 11/2009 |
| JP | 2010-093070 A | 4/2010 |
| JP | 2010-135774 A | 6/2010 |
| JP | 2010-205987 A | 9/2010 |
| JP | 2011-146694 A | 7/2011 |
| KR | 2002-0038482 A | 5/2002 |
| KR | 10-0745254 | 8/2007 |
| KR | 2008-0044763 A | 5/2008 |
| KR | 2008-0066678 A | 7/2008 |
| KR | 2009-0119666 A | 11/2009 |
| KR | 2010-0039806 A | 4/2010 |
| KR | 2010-0100603 A | 9/2010 |
| TW | 588209 | 5/2004 |
| WO | WO-03/040441 | 5/2003 |
| WO | WO-03/098699 | 11/2003 |
| WO | WO-2004/114391 | 12/2004 |
| WO | WO-2007/058231 | 5/2007 |
| WO | WO-2007/142167 | 12/2007 |
| WO | WO-2011/074407 | 6/2011 |

OTHER PUBLICATIONS

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Kimizuka.N et al., "Spinel, YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures over 1000° C.", Journal of Solid State Chemistry, 1985, vol. 60, pp. 382-384.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Kitzerow.H et al., "Observation of Blue Phases in Chiral Networks", Liquid Crystals, 1993, vol. 14, No. 3, pp. 911-916.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Kikuchi.H et al., "Polymer-Stabilized Liquid Crystal Blue Phases", Nature Materials, Sep. 2, 2002, vol. 1, pp. 64-68.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Nomura.K et al., "Thin-Film Transistor Fabricated in Single-Crystalline Transparent Oxide Semiconductor", Science, May 23, 2003, vol. 300, No. 5623, pp. 1269-1272.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

(56) References Cited

OTHER PUBLICATIONS

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Lee.H et al., "Current Status of, Challenges to, and Perspective View of AM-OLED ", IDW '06 : Proceedings of the 13th International Display Workshops, Dec. 7, 2006, pp. 663-666.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hirao.T et al., "Novel Top-Gate Zinc Oxide Thin-Film Transistors (ZnO TFTs) for AMLCDs", Journal of the SID, 2007, vol. 15, No. 1, pp. 17-22.

Park.S et al., "Challenge to Future Displays: Transparent AM-OLED Driven by PEALD Grown ZnO TFT", IMID '07 Digest, 2007, pp. 1249-1252.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Miyasaka.M, "SUFTLA Flexible Microelectronics on Their Way to Business", SID Digest '07 : SID International Symposium Digest of Technical Papers, 2007, vol. 38, pp. 1673-1676.

Kurokawa.Y et al., "UHF RFCPUS on Flexible and Glass Substrates for Secure RFID Systems", Journal of Solid-State Circuits , 2008, vol. 43, No. 1, pp. 292-299.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Park.J et al., "Amorphous Indium—Gallium—Zinc Oxide TFTs and Their Application for Large Size AMOLED", AM-FPD '08 Digest of Technical Papers, Jul. 2, 2008, pp. 275-278.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.

Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Ohara.H et al., "21.3:4.0 In. QVGA AMOLED Display Using In—Ga—Zn—Oxide TFTs With a Novel Passivation Layer", SID Digest '09 : SID International Symposium Digest of Technical Papers, May 31, 2009, pp. 284-287.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Park.J et al., "High performance amorphous oxide thin film transistors with self-aligned top-gate structure", IEDM 09: Technical Digest of International Electron Devices Meeting, Dec. 7, 2009, pp. 191-194.

Nakamura.M, "Synthesis of Homologous Compound with New Long-Period Structure", NIRIM Newsletter, Mar. 1, 1995, vol. 150, pp. 1-4.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Orita.M et al., "Amorphous transparent conductive oxide InGaO3(ZnO)m (m<4):a Zn4s conductor", Philosophical Magazine, 2001, vol. 81, No. 5, pp. 501-515.

Janotti.A et al., "Oxygen Vacancies in ZnO", Appl. Phys. Lett. (Applied Physics Letters) , 2005, vol. 87, pp. 122102-1-122102-3.

Clark.S et al., "First Principles Methods Using CASTEP", Zeitschrift fur Kristallographie, 2005, vol. 220, pp. 567-570.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Park.J et al., "Electronic Transport Properties of Amorphous Indium—Gallium—Zinc Oxide Semiconductor Upon Exposure to Water", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Oba.F et al., "Defect energetics in ZnO: A hybrid Hartree-Fock density functional study", Phys. Rev. B (Physical Review. B), 2008, vol. 77, pp. 245202-1-245202-6.

(56) References Cited

OTHER PUBLICATIONS

Kim.S et al., "High-Performance oxide thin film transistors passivated by various gas plasmas", 214th ECS Meeting, 2008, No. 2317, ECS.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Park.Sang-Hee et al., "42.3: Transparent ZnO Thin Film Transistor for the Application of High Aperture Ratio Bottom Emission AMOLED Display", SID Digest '08 : SID International Symposium Digest of Technical Papers, May 20, 2008, vol. 39, pp. 629-632.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Mo.Y et al., "Amorphous Oxide TFT Backplanes for Large Size AMOLED Displays", IDW '08 : Proceedings of the 6th International Display Workshops, Dec. 3, 2008, pp. 581-584.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Jeon.S et al., "180nm Gate Length Amorphous InGaZnO Thin Film Transistor for High Density Image Sensor Applications", IEDM 10: Technical Digest of International Electron Devices Meeting, Dec. 6, 2010, pp. 504-507.

Morosawa.N et al., "35.3: Distinguished Paper: A Novel Self-Aligned Top-Gate Oxide TFT for AM-OLED Displays", SID Digest '11 : SID International Symposium Digest of Technical Papers, May 17, 2011, pp. 479-482.

Kim.S et al., "Source/Drain Formation of Self-Aligned Top-Gate Amorphous GaInZnO Thin-Film Transistors by NH3 Plasma Treatment", IEEE Electron Device Letters, Apr. 1, 2009, vol. 30, No. 4, pp. 374-376.

Ahn.B et al., "Comparison of the effects of Ar and H2 plasmas on the performance of homojunctioned amorphous indium gallium zinc oxide thin film transistors", Appl. Phys. Lett. (Applied Physics Letters), 2008, vol. 93, No. 20, pp. 203506-1-203506-3.

Ohtomo.A et al., "Single crystalline ZnO films grown on lattice-matched ScAlMgO4 (0001) substrates", Appl. Phys. Lett. (Applied Physics Letters), Oct. 25, 1999, vol. 75, No. 17, pp. 2635-2637.

* cited by examiner

SEMICONDUCTOR DEVICE AND METHOD FOR MANUFACTURING THE SAME

BACKGROUND OF THE INVENTION

1. Field of the Invention

The present invention relates to a semiconductor device which is provided with a circuit including a semiconductor element such as a transistor, and a method for manufacturing the semiconductor device. For example, the present invention relates to a power device which is mounted on a power supply circuit; a semiconductor integrated circuit including a memory, a thyristor, a converter, an image sensor, or the like; and an electronic device on which an electro-optical device typified by a liquid crystal display panel, a light-emitting display device including a light-emitting element, or the like is mounted as a component.

In this specification, a semiconductor device means all types of devices which can function by utilizing semiconductor characteristics, and an electro-optical device, a light-emitting display device, a semiconductor circuit, and an electronic device are all semiconductor devices.

2. Description of the Related Art

Transistors formed over a glass substrate or the like are manufactured using amorphous silicon, polycrystalline silicon, or the like, as typically seen in liquid crystal display devices. Although transistors manufactured using amorphous silicon have low field-effect mobility, they can be manufactured over a larger glass substrate. On the other hand, although transistors manufactured using polycrystalline silicon have high field-effect mobility, they are not suitable for being manufactured over a larger glass substrate.

In contrast to transistors manufactured using silicon, attention has been drawn to a technique by which a transistor is manufactured using an oxide semiconductor and applied to an electronic device or an optical device. For example, Patent Document 1 and Patent Document 2 disclose a technique by which a transistor is manufactured using zinc oxide or an In—Ga—Zn—O-based oxide as an oxide semiconductor and is used as a switching element of a pixel or the like of a display device.

Patent Document 3 discloses a technique by which, in a staggered transistor including an oxide semiconductor, a highly conductive oxide semiconductor containing nitrogen is provided as buffer layers between a source region and a source electrode and between a drain region and a drain electrode, and thereby contact resistance between the oxide semiconductor and the source electrode and between the oxide semiconductor and the drain electrode is reduced.

Non-Patent Document 1 discloses a top-gate oxide semiconductor transistor in which a channel region, a source region, and a drain region are formed in a self-aligned manner by performing argon plasma treatment on an oxide semiconductor which is partly exposed to decrease resistivity of the oxide semiconductor in the exposed portions.

However, in this manner, when argon plasma treatment is performed on surfaces of the oxide semiconductor which are exposed, the oxide semiconductor in regions to be the source region and the drain region is also etched off, so that the source region and the drain region are reduced in thickness (see FIG. 8 of Non-Patent Document 1). Consequently, resistance of the source region and the drain region is increased, resulting in an increase in probability of occurrence of defective products due to over-etching caused when the thickness is reduced.

This problem is serious in the case where the atomic radius of ion species used in the plasma treatment performed on the oxide semiconductor is large.

There is no problem when the thickness of the oxide semiconductor layer is large enough; however, in the case where the channel length is set to less than or equal to 200 nm, the thickness of the oxide semiconductor layer in a region to be a channel is expected to be less than or equal to 20 nm, preferably less than or equal to 10 nm in order to prevent a short-channel effect. When such a thin oxide semiconductor layer is used, the plasma treatment as described above is unfavorable.

REFERENCE

Patent Document

[Patent Document 1] Japanese Published Patent Application No. 2007-123861
[Patent Document 2] Japanese Published Patent Application No. 2007-096055
[Patent Document 3] Japanese Published Patent Application No. 2010-135774

Non-Patent Document

[Non-Patent Document 1] S. Jeon et al. "180 nm Gate Length Amorphous InGaZnO Thin Film Transistor for High Density Image Sensor Applications", IEDM Tech. Dig., p. 504, 2010

SUMMARY OF THE INVENTION

It is an object to provide a semiconductor device including a transistor in which variation in electric characteristics due to a short-channel effect is less likely to be caused.

It is another object to provide a semiconductor device which is miniaturized.

In addition, it is another object to provide a semiconductor device whose on-state current is improved.

An embodiment of the present invention is a semiconductor device provided with an oxide semiconductor film including a pair of second oxide semiconductor regions which are amorphous regions and a first oxide semiconductor region located between the pair of second oxide semiconductor regions, a gate insulating film, and a gate electrode provided over the first oxide semiconductor region with the gate insulating film interposed therebetween.

The first oxide semiconductor region includes a material which is a non-single-crystal including a phase which has a triangular or hexagonal atomic arrangement when seen from the direction perpendicular to an a-b plane and in which metal atoms are arranged in a layered manner or metal atoms and oxygen atoms are arranged in a layered manner when seen from the direction perpendicular to a c-axis.

In this specification, an oxide semiconductor film which includes a non-single-crystal including a phase which has a triangular or hexagonal atomic arrangement when seen from the direction perpendicular to the a-b plane and in which metal atoms are arranged in a layered manner or metal atoms and oxygen atoms are arranged in a layered manner when seen from the direction perpendicular to the c-axis is referred to as a c-axis-aligned crystalline oxide semiconductor (CAAC-OS) film.

CAAC-OS is not a single crystal, but this does not mean that CAAC-OS is composed of only an amorphous component. Although CAAC-OS includes a crystallized portion (crystalline portion), a boundary between one crystalline portion and another crystalline portion is not clear in some cases. Nitrogen may be substituted for part of oxygen contained in CAAC-OS. The c-axes of individual crystalline portions included in CAAC-OS may be aligned in one direction (e.g., the direction perpendicular to a surface of a substrate over which CAAC-OS is formed, a surface of CAAC-OS, a surface of a CAAC-OS film, an interface of CAAC-OS, or the like). Alternatively, normals of the a-b planes of individual crystalline portions included in CAAC-OS may be aligned in one direction (e.g., the direction perpendicular to a surface of a substrate over which CAAC-OS is formed, a surface of CAAC-OS, a surface of a CAAC-OS film, an interface of CAAC-OS, or the like).

CAAC-OS becomes a conductor, a semiconductor, or an insulator depending on its composition or the like. CAAC-OS transmits or does not transmit visible light depending on its composition or the like. As an example of such CAAC-OS, there is a material which is formed into a film shape and has a triangular or hexagonal atomic arrangement when observed from the direction perpendicular to a surface of a film, a surface of a substrate, or an interface and in which metal atoms are arranged in a layered manner or metal atoms and oxygen atoms (or nitrogen atoms) are arranged in a layered manner when a cross section of the film is observed.

The oxide semiconductor film can contain two or more kinds of elements selected from In, Ga, Sn, and Zn.

The pair of second oxide semiconductor regions serve as a source region and a drain region of a transistor, and the first oxide semiconductor region serves as a channel region of the transistor.

In a top-gate transistor in which a channel region is formed using an oxide semiconductor film, a source region and a drain region can be formed in such a manner that ions are added to the oxide semiconductor film with the use of a gate electrode as a mask. When the source region and the drain region are formed using the gate electrode as a mask, the source region and the drain region do not overlap with the gate electrode. Therefore, unnecessary parasitic capacitance can be reduced, and thus, the transistor can operate at high speed.

In a bottom-gate transistor in which a channel region is formed using an oxide semiconductor film, a source region and a drain region can be formed in such a manner that ions are added to the oxide semiconductor film with the use of an insulating film serving as a channel protective film as a mask. The insulating film serving as a channel protective film is formed so as to protect a back channel portion of the oxide semiconductor film and is preferably formed with a single layer or a stack using one or more of silicon oxide, silicon nitride, aluminum oxide, aluminum nitride, and the like.

Further, by forming the source region and the drain region in the above manner, contact resistance between the oxide semiconductor film and a wiring material used for a source electrode, a drain electrode, or the like can be reduced. Accordingly, the on-state current of the transistor can be improved.

Ions to form the source region and the drain region in the transistor can be added by an ion doping method, an ion implantation method, or the like. The ions to be added can be selected from hydrogen and rare gases when the ions are added to an oxide semiconductor film covered with an insulating film or the like. When the ions are added to an exposed oxide semiconductor film, hydrogen can be added as the ions.

The amount of ions contained in the source region and the drain region is preferably greater than or equal to $5 \times 10^{18}$ atoms/cm$^3$ and less than or equal to $1 \times 10^{22}$ atoms/cm$^3$ through the addition of the ions. The carrier density of the second oxide semiconductor regions can be increased by increasing the concentration of ions which have been added; however, when the concentration of ions which have been added is too high, transfer of carriers is inhibited and the conductivity is decreased.

Other than an ion doping method, an ion implantation method, or the like, ions can be added to the oxide semiconductor film by a method in which ions are not implanted. For example, the ions can be added in the following manner: plasma is generated in an atmosphere of a gas containing an element to be added and plasma treatment is performed on an object to which the ions are added. A dry etching apparatus, a plasma CVD apparatus, a high-density plasma CVD apparatus, or the like can be used to generate the plasma.

Heat treatment may be performed after the ions are added. The heat treatment is preferably performed at a temperature at which the source region and the drain region are not crystallized.

In addition, by forming the second oxide semiconductor regions to which the ions are added as the source region and the drain region of the transistor, contact resistance between a wiring and the source region and between a wiring and the drain region can be reduced, which increases the on-state current of the transistor.

In accordance with an embodiment of the present invention, it is possible to provide a semiconductor device including a transistor in which variation in electric characteristics due to a short-channel effect is less likely to be caused. It is also possible to provide a semiconductor device which is miniaturized. In addition, it is possible to provide a semiconductor device whose on-state current is improved.

In the case where ions of an element whose atomic radius is large such as a rare gas are added to the oxide semiconductor as described above, by adding the ions through a protective film such as an insulating film, the source region and the drain region can be formed without over-etching of the oxide semiconductor film.

DETAILED DESCRIPTION OF THE INVENTION

Figure 1A:
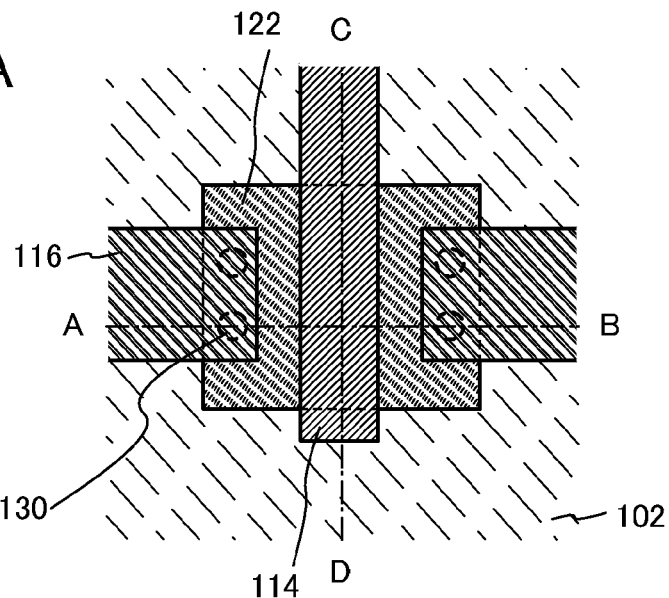
FIGS. 1A to 1C are a top view and cross-sectional views illustrating an example of a semiconductor device according to an embodiment of the present invention.

Embodiments of the present invention will be described in detail with reference to the accompanying drawings. Note that the present invention is not limited to the description below, and it is easily understood by those skilled in the art that modes and details thereof can be modified in various ways without departing from the spirit and the scope of the present invention. Therefore, the present invention should not be construed as being limited to the description in the embodiments below. Note that the same portions or portions having similar functions in the structure of the present invention described below are denoted by the same reference numerals in different drawings and repetitive description thereof will be omitted.

Note that in each drawing described in this specification, the size, the film thickness, or the region of each component is exaggerated for clarity in some cases. Therefore, embodiments of the present invention are not limited to such scales.

Note that terms such as "first", "second", and "third" in this specification are used in order to avoid confusion among components, and the terms do not limit the components numerically. Therefore, for example, the term "first" can be replaced with the term "second", "third", or the like as appropriate.

Embodiment 1

In this embodiment, an example of a top-gate transistor in which a channel region is formed using a first oxide semiconductor region to which ions are not added, and a source region and a drain region are formed using second oxide semiconductor regions to which ions are added and which are in the same layer as the channel region will be described with reference to FIGS. 1A to 1C and FIGS. 2A to 2D.

Figure 1B:
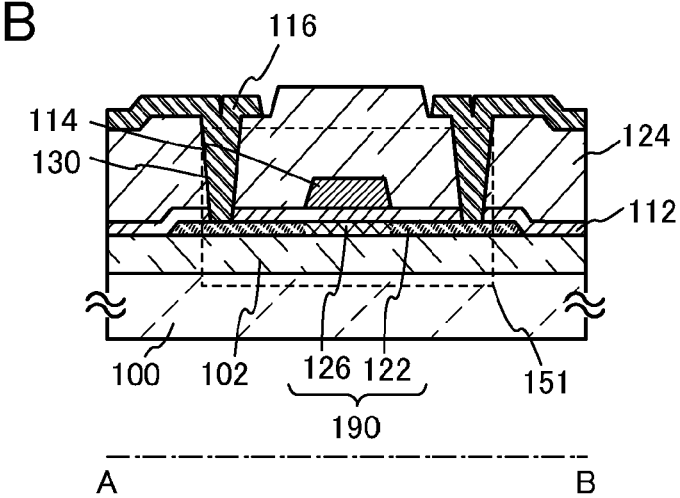
Figure 1C:
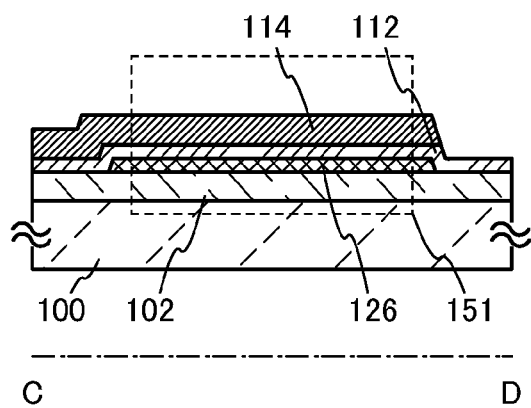

FIGS. 1A to 1C are a top view and cross-sectional views of a top-gate transistor. Here, FIG. 1A is a top view, FIG. 1B is a cross-sectional view taken along A-B in FIG. 1A, and FIG. 1C is a cross-sectional view taken along C-D in FIG. 1A. Note that in FIG. 1A, some components of a transistor 151 (e.g., a gate insulating film 112 and an interlayer insulating film 124) are omitted for simplicity.

The transistor 151 illustrated in FIGS. 1A to 1C includes an oxide semiconductor film 190 over an insulating surface which includes a first oxide semiconductor region 126 and a pair of second oxide semiconductor regions 122, the gate insulating film 112 over the oxide semiconductor film 190, a gate electrode 114 over the gate insulating film 112, the interlayer insulating film 124 which covers the gate insulating film 112 and the gate electrode 114, and wirings 116 which are connected to the pair of second oxide semiconductor regions 122 through contact holes 130 provided in the interlayer insulating film 124. In this embodiment, the case where a base insulating film 102 is provided as the insulating surface over a substrate 100 is described.

Here, the pair of second oxide semiconductor regions 122 serves as a source region and a drain region of the transistor 151, and the first oxide semiconductor region 126 serves as a channel region of the transistor 151.

The oxide semiconductor film 190 including the first oxide semiconductor region 126 and the pair of second oxide semiconductor regions 122 may be formed using a material containing two or more kinds of elements selected from In, Ga, Sn, and Zn. For example, the oxide semiconductor film 190 is formed using an In—Ga—Zn—O-based oxide semiconductor.

In addition, the first oxide semiconductor region 126 includes CAAC-OS.

The pair of second oxide semiconductor regions 122 are amorphous regions. Each of the pair of second oxide semiconductor regions 122 contains one or more elements selected from hydrogen and rare gases, and the concentration thereof is preferably higher than or equal to $5\times10^{18}$ atoms/cm$^3$ and lower than or equal to $1\times10^{22}$ atoms/cm$^3$.

The conductivity of the pair of second oxide semiconductor regions 122 is higher than or equal to 10 S/cm and lower than or equal to 1000 S/cm, preferably higher than or equal to 100 S/cm and lower than or equal to 1000 S/cm. When the conductivity is too low, the on-state current of the transistor is decreased. By setting the conductivity not to be too high, an influence of an electric field generated in the pair of second oxide semiconductor regions 122 can reduced and thus a short-channel effect can be suppressed.

The interlayer insulating film 124 may be formed with a single layer or a stack using, for example, one or more of silicon oxide, silicon oxynitride, silicon nitride oxide, silicon nitride, aluminum oxide, and the like. For example, the interlayer insulating film 124 may be formed by a thermal oxidation method, a CVD method, a sputtering method, or the like. A silicon nitride film or a silicon nitride oxide film is preferably used as the interlayer insulating film 124.

The wirings 116 may have a structure similar to that of the gate electrode 114 described later.

With such a structure, little parasitic capacitance is generated between the gate electrode 114 and the pair of second oxide semiconductor regions 122 and variation in the threshold voltage can be reduced even when the transistor is miniaturized and thus the channel length is reduced. Further, contact resistance between the pair of second oxide semiconductor regions 122 and the wirings 116 is reduced, and thus the on-state current of the transistor can be increased. Furthermore, the concentration of hydrogen in the first oxide semiconductor region 126 is reduced, and thus the electric characteristics and reliability of the transistor can be improved.

Although not illustrated, it is also possible that the gate insulating film 112 is formed only over the first oxide semiconductor region 126 and does not cover the pair of second oxide semiconductor regions 122.

<Example of Method for Manufacturing Transistor>

Next, a method for manufacturing the transistor illustrated in FIGS. 1A to 1C will be described with reference to FIGS. 2A to 2D.

Figure 2A:
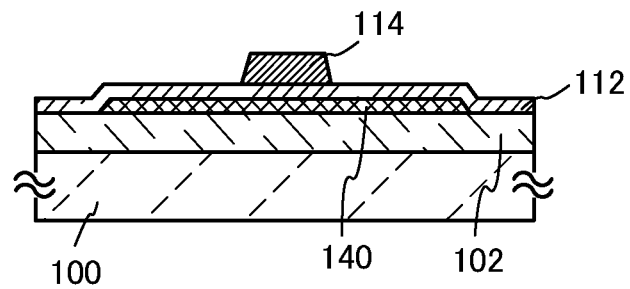
FIGS. 2A to 2D are cross-sectional views illustrating an example of a manufacturing process of a semiconductor device according to an embodiment of the present invention.

First, as illustrated in FIG. 2A, the base insulating film 102 is formed over the substrate 100.

There is no particular limitation on a material and the like of the substrate 100 as long as the material has heat resistance high enough to withstand at least heat treatment performed later. For example, a glass substrate, a ceramic substrate, a quartz substrate, a sapphire substrate, or the like may be used as the substrate 100. Alternatively, a single crystal semiconductor substrate or a polycrystalline semiconductor substrate made of silicon, silicon carbide, or the like; a compound semiconductor substrate made of silicon germanium, gallium nitride, or the like; an SDI substrate; or the like may be used as the substrate 100. Still alternatively, any of these substrates provided with a semiconductor element may be used as the substrate 100.

A flexible substrate may alternatively be used as the substrate 100. In the case where a transistor is provided over the flexible substrate, the transistor may be formed directly over the flexible substrate, or the transistor may be formed over a different substrate and then separated from the substrate to be transferred to the flexible substrate. In order to separate the transistor from the substrate to be transferred to the flexible substrate, a separation layer is preferably provided between the substrate and the transistor.

The base insulating film 102 may be a single layer or a stack formed using one or more of a silicon oxide film, a silicon oxynitride film, a silicon nitride oxide film, a silicon nitride film, and an aluminum oxide film.

In this specification, silicon oxynitride refers to a substance that contains more oxygen than nitrogen and for example, silicon oxynitride contains oxygen, nitrogen, silicon, and hydrogen at concentrations ranging from higher than or equal to 50 at. % and lower than or equal to 70 at. %, higher than or equal to 0.5 at. % and lower than or equal to 15 at. %, higher than or equal to 25 at. % and lower than or equal to 35 at. %, and higher than or equal to 0 at. % and lower than or equal to 10 at. %, respectively. Further, silicon nitride oxide contains more nitrogen than oxygen and for example, silicon nitride oxide contains oxygen, nitrogen, silicon, and hydrogen at concentrations ranging from higher than or equal to 5 at. % and lower than or equal to 30 at. %, higher than or equal to 20 at. % and lower than or equal to 55 at. %, higher than or equal to 25 at. % and lower than or equal to 35 at. %, and higher than or equal to 10 at. % and lower than or equal to 25 at. %, respectively. Note that percentages of oxygen, nitrogen, silicon, and hydrogen fall within the aforementioned ranges in the case where measurement is performed using Rutherford backscattering spectrometry (RBS) or hydrogen forward scattering (HFS). In addition, the total of the percentages of the constituent elements does not exceed 100 at. %.

As the base insulating film 102, a film from which oxygen is released by heating may be used.

To release oxygen by heating means that the released amount of oxygen which is converted into oxygen atoms is greater than or equal to $1.0 \times 10^{18}$ atoms/cm$^3$, preferably greater than or equal to $3.0 \times 10^{20}$ atoms/cm$^3$ in thermal desorption spectroscopy (TDS).

Here, a method in which the amount of released oxygen is measured by conversion into oxygen atoms using TDS analysis will be described.

The amount of a released gas in TDS analysis is proportional to the integral value of a spectrum. Therefore, the amount of a released gas can be calculated from the ratio between the integral value of a spectrum of an insulating film and the reference value of a standard sample. The reference value of a standard sample is the ratio between the density of a predetermined atom contained in the sample and the integral value of a spectrum.

For example, the number of released oxygen molecules ($N_{O2}$) from an insulating film can be calculated according to a numerical expression 1 with TDS analysis results of a silicon wafer containing hydrogen at a predetermined density which is the standard sample and TDS analysis results of the insulating film. Here, all spectra having a mass number of 32 which are obtained by TDS analysis are assumed to originate from an oxygen molecule. $CH_3OH$, which is given as a gas having a mass number of 32, is not taken into consideration on the assumption that it is unlikely to be present. Further, an oxygen molecule including an oxygen atom having a mass number of 17 or 18 which is an isotope of an oxygen atom is not taken into consideration either, because the proportion of such a molecule in the natural world is minimal.

$$N_{O2} = N_{H2}/S_{H2} \times S_{O2} \times \alpha \qquad \text{(numerical expression 1)}$$

$N_{H2}$ is the value obtained by conversion of the number of hydrogen molecules desorbed from the standard sample into density. $S_{H2}$ is the integral value of a spectrum when the standard sample is subjected to TDS analysis. Here, the reference value of the standard sample is set to $N_{H2}/S_{H2}$. $S_{O2}$ is the integral value of a spectrum when the insulating film is subjected to TDS analysis. $\alpha$ is a coefficient affecting the intensity of the spectrum in the TDS analysis. Refer to Japanese Published Patent Application No. H6-275697 for details of the numerical expression 1. Note that the amount of released oxygen from the above insulating film is measured with a thermal desorption spectroscopy apparatus produced by ESCO Ltd., EMD-WA1000S/W, using a silicon wafer containing hydrogen atoms at $1 \times 10^{16}$ atoms/cm$^3$ as the standard sample.

Further, in TDS analysis, part of oxygen is detected as an oxygen atom. The ratio between oxygen molecules and oxygen atoms can be calculated from the ionization rate of the oxygen molecules. Note that, since the above a includes the ionization rate of the oxygen molecules, the number of the released oxygen atoms can also be estimated through the evaluation of the number of the released oxygen molecules.

Note that $N_{O2}$ is the number of the released oxygen molecules. In the insulating film, the amount of released oxygen converted into oxygen atoms is twice the number of the released oxygen molecules.

In the above structure, the insulating film from which oxygen is released by heating may be oxygen-excess silicon oxide ($SiO_X (X>2)$). In the oxygen-excess silicon oxide ($SiO_X (X>2)$), the number of oxygen atoms per unit volume is more than twice the number of silicon atoms per unit volume. The number of silicon atoms and the number of oxygen atoms per unit volume are measured by Rutherford backscattering spectrometry.

By supplying oxygen from the base insulating film to the oxide semiconductor film, an interface state between the base insulating film and the oxide semiconductor film can be reduced. As a result, electric charge or the like which may be produced due to an operation of the transistor or the like can be prevented from being trapped at the interface between the base insulating film and the oxide semiconductor film, and thereby a transistor with less deterioration in electric characteristics can be provided.

Further, electric charge is generated owing to oxygen deficiency in the oxide semiconductor film in some cases. In general, when oxygen deficiency is caused in the oxide semiconductor film, part of the oxygen deficiency becomes a donor and generates an electron which is a carrier. As a result, the threshold voltage of a transistor shifts in the negative direction. This tendency occurs remarkably in oxygen deficiency caused on the back channel side. Note that a back channel in this embodiment refers to the vicinity of an interface of the oxide semiconductor film on the base insulating film side. When oxygen is sufficiently supplied from the base insulating film to the oxide semiconductor film, oxygen deficiency in the oxide semiconductor film which causes the negative shift of the threshold voltage can be reduced.

In other words, when oxygen deficiency is caused in the oxide semiconductor film, it is difficult to prevent trapping of electric charge at the interface between the base insulating film and the oxide semiconductor film. However, by providing an insulating film from which oxygen is released by heating as the base insulating film, the interface state between the oxide semiconductor film and the base insulating film and the oxygen deficiency in the oxide semiconductor film can be reduced, and the influence of the trapping of electric charge at the interface between the oxide semiconductor film and the base insulating film can be made small.

Then, an oxide semiconductor film 140 is formed over the base insulating film 102.

The oxide semiconductor film 140 is formed in such a manner that an oxide semiconductor film with a thickness of greater than or equal to 1 nm and less than or equal to 50 nm is formed by a sputtering method, a mask is formed over the oxide semiconductor film, and the oxide semiconductor film is selectively etched with the use of the mask.

The mask used in the etching of the oxide semiconductor film can be formed as appropriate by a photolithography process, an inkjet method, a printing method, or the like. Wet etching or dry etching can be employed as appropriate for the etching of the oxide semiconductor film.

A sputtering apparatus used for forming the oxide semiconductor film will be described in detail below.

The leakage rate of a treatment chamber in which the oxide semiconductor film is formed is preferably lower than or equal to $1 \times 10^{-10}$ Pa·m$^3$/sec., whereby entry of an impurity into the film to be formed by a sputtering method can be decreased.

In order to decrease the leakage rate, internal leakage as well as external leakage needs to be reduced. The external leakage refers to inflow of a gas from the outside of a vacuum system through a minute hole, a sealing defect, or the like. The internal leakage is due to leakage through a partition, such as a valve, in a vacuum system or due to a released gas from an internal member. Measures need to be taken from both aspects of external leakage and internal leakage in order that the leakage rate be lower than or equal to $1 \times 10^{-10}$ Pa·m$^3$/sec.

In order to decrease external leakage, an open/close portion of the treatment chamber is preferably sealed with a metal gasket. For the metal gasket, a metal material covered with iron fluoride, aluminum oxide, or chromium oxide is preferably used. The metal gasket realizes higher adhesion than an O-ring, and can reduce external leakage. Further, with the use of a metal material covered with iron fluoride, aluminum oxide, chromium oxide, or the like which is in the passive state, a released gas containing hydrogen generated from the metal gasket is suppressed, so that internal leakage can also be reduced.

As a member for forming an inner wall of the treatment chamber, aluminum, chromium, titanium, zirconium, nickel, or vanadium, in which the amount of a released gas containing hydrogen is small, is used. An alloy material containing iron, chromium, nickel, or the like covered with the above-mentioned material may also be used. The alloy material containing iron, chromium, nickel, or the like is rigid, resistant to heat, and suitable for processing. Here, when surface unevenness of the member is decreased by polishing or the like to reduce the surface area, the released gas can be reduced. Alternatively, the above-mentioned member of a film formation apparatus may be covered with iron fluoride, aluminum oxide, chromium oxide, or the like which is in the passive state.

Furthermore, it is preferable to provide a refiner for a sputtering gas just in front of the treatment chamber. At this time, the length of a pipe between the refiner and the treatment chamber is less than or equal to 5 m, preferably less than or equal to 1 m. When the length of the pipe is less than or equal to 5 m or less than or equal to 1 m, the influence of the released gas from the inner wall of the pipe can be reduced with a reduction in the length of the pipe.

Evacuation of the treatment chamber is preferably performed with a rough vacuum pump such as a dry pump and a high vacuum pump such as a sputter ion pump, a turbo molecular pump, or a cryopump in appropriate combination. The turbo molecular pump has an outstanding capability in removing a large-sized molecule, whereas it has a low capability in removing hydrogen or water. Hence, combination of a cryopump having a high capability in removing water and a sputter ion pump having a high capability in removing hydrogen is effective.

An adsorbate present at the inner wall of the treatment chamber does not affect the pressure in the treatment chamber because it is adsorbed on the inner wall, but the adsorbate leads to release of a gas at the time of the evacuation of the treatment chamber. Therefore, although the leakage rate and the evacuation rate do not have a correlation, it is important that the adsorbate present in the treatment chamber be desorbed as much as possible and evacuation be performed in advance with the use of a pump having high evacuation capability. Note that the treatment chamber may be subjected to baking for promotion of desorption of the adsorbate. By the baking, the rate of desorption of the adsorbate can be increased about tenfold. The baking should be performed at a temperature of higher than or equal to 100° C. and lower than or equal to 450° C. At this time, when the adsorbate is removed while an inert gas is introduced, the rate of desorption of water or the like which is difficult to desorb only by evacuation can be further increased.

A power supply device for generating plasma in a sputtering method can be an RF power supply device, an AC power supply device, a DC power supply device, or the like as appropriate.

As a target, a metal oxide target containing zinc can be used. As the target, a four-component metal oxide such as an In—Sn—Ga—Zn—O-based metal oxide, a three-component metal oxide such as an In—Ga—Zn—O-based metal oxide, an In—Sn—Zn—O-based metal oxide, an In—Al—Zn—O-based metal oxide, a Sn—Ga—Zn—O-based metal oxide, an Al—Ga—Zn—O-based metal oxide, or a Sn—Al—Zn—O-based metal oxide, or a two-component metal oxide such as an In—Zn—O-based metal oxide or a Sn—Zn—O-based metal oxide can be used.

As an example of the target, a metal oxide target containing In, Ga, and Zn has a composition ratio where $In_2O_3:Ga_2O_3:ZnO=1:1:1$ [molar ratio]. Alternatively, a target having a composition ratio where $In_2O_3:Ga_2O_3:ZnO=1:1:2$ [molar ratio], a target having a composition ratio where $In_2O_3:Ga_2O_3:ZnO=1:1:4$ [molar ratio], or a target having a composition ratio where $In_2O_3:Ga_2O_3:ZnO=2:1:8$ [molar ratio] can be used.

As a sputtering gas, a rare gas (typically argon), oxygen, or a mixed gas of a rare gas and oxygen is used as appropriate. It is preferable that a high-purity gas from which impurities such as hydrogen, water, a hydroxyl group, and hydride are removed be used as a sputtering gas.

The substrate temperature in forming the film is higher than or equal to 150° C. and lower than or equal to 450° C., preferably higher than or equal to 200° C. and lower than or equal to 350° C. By forming the film while the substrate is heated to a temperature of higher than or equal to 150° C. and lower than or equal to 450° C., preferably higher than or equal to 200° C. and lower than or equal to 350° C., entry of moisture (e.g., hydrogen) or the like into the film can be prevented. In addition, a CAAC-OS film that is an oxide semiconductor film including a crystal can be formed.

Further, heat treatment is preferably performed on the substrate 100 after the oxide semiconductor film is formed, so that hydrogen is released from the oxide semiconductor film and part of oxygen contained in the base insulating film 102 is diffused into the oxide semiconductor film and the base insulating film 102 in the vicinity of the interface with the oxide semiconductor film. Through the heat treatment, a CAAC-OS film with higher crystallinity can be formed.

The temperature of the heat treatment is preferably a temperature at which hydrogen is released from the oxide semiconductor film and part of oxygen contained in the base insulating film 102 is released and diffused into the oxide semiconductor film. The temperature is typically higher than or equal to 200° C. and lower than the strain point of the substrate 100, preferably higher than or equal to 250° C. and lower than or equal to 450° C.

For the heat treatment, a rapid thermal annealing (RTA) apparatus can be used. With the use of an RTA apparatus, the heat treatment can be performed at a temperature of higher than or equal to the strain point of the substrate if the heating time is short. Therefore, time to form an oxide semiconductor film in which the proportion of a crystalline region is higher than that of an amorphous region can be shortened.

The heat treatment can be performed in an inert gas atmosphere; typically, it is preferably performed in a rare gas (such as helium, neon, argon, xenon, or krypton) atmosphere or a nitrogen atmosphere. Alternatively, the heat treatment may be performed in an oxygen atmosphere or a reduced pressure atmosphere. The heating time is 3 minutes to 24 hours. As the treatment time is increased, the proportion of a crystalline region with respect to that of an amorphous region in the oxide semiconductor film can be increased. Note that heat treatment for longer than 24 hours is not preferable because the productivity is reduced.

A method for forming the CAAC-OS film is not limited to the method described in this embodiment.

As described above, in the process for forming the oxide semiconductor film, entry of impurities is suppressed as much as possible through control of the pressure of the treatment chamber, leakage rate of the treatment chamber, and the like, whereby entry of impurities such as hydrogen to be contained in the oxide insulating film and the oxide semiconductor film can be reduced. In addition, diffusion of impurities such as hydrogen from the oxide insulating film to the oxide semiconductor film can be reduced. Hydrogen contained in the oxide semiconductor is reacted with oxygen bonded to a metal atom to be water, and in addition, a defect is formed in a lattice from which oxygen is detached (or a portion from which oxygen is detached).

Thus, by reducing impurities as much as possible in the step of forming the oxide semiconductor film, defects in the oxide semiconductor film can be reduced. As described above, by using CAAC-OS that is highly purified through removal of the impurities as much as possible for the channel region, the amount of change in threshold voltage of the transistor before and after light irradiation or the BT stress test is small, whereby the transistor can have stable electric characteristics.

Note that a metal oxide which can be used for the oxide semiconductor film has a band gap of greater than or equal to 2 eV, preferably greater than or equal to 2.5 eV, more preferably greater than or equal to 3 eV. In this manner, the off-state current of the transistor can be reduced by using a metal oxide having a wide band gap.

Next, the gate insulating film 112 and the gate electrode 114 are formed over the oxide semiconductor film 140. The gate electrode 114 is formed in such a manner than a conductive film is formed, a mask is formed over the conductive film, and the conductive film is selectively etched with the use of the mask.

The gate insulating film 112 may be formed with a single layer or a stack using, for example, one or more of silicon oxide, silicon oxynitride, silicon nitride oxide, silicon nitride, aluminum oxide, hafnium oxide, gallium oxide, and the like. For example, the gate insulating film 112 may be formed by a thermal oxidation method, a CVD method, a sputtering method, or the like. As the gate insulating film 112, a film from which oxygen is released by heating may be used. By using a film from which oxygen is released by heating as the gate insulating film 112, oxygen deficiency caused in the oxide semiconductor can be reduced and deterioration in electric characteristics of the transistor can be suppressed.

When the gate insulating film 112 is formed using a high-k material such as hafnium silicate ($HfSiO_x$), hafnium silicate to which nitrogen is added ($HfSi_xO_yN_z$), hafnium aluminate to which nitrogen is added ($HfAl_xO_yN_z$), hafnium oxide, or yttrium oxide, gate leakage current can be reduced. Further, a stacked structure can be employed, in which a high-k material and one or more of silicon oxide, silicon oxynitride, silicon nitride, silicon nitride oxide, aluminum oxide, aluminum oxynitride, and gallium oxide are stacked. For example, the thickness of the gate insulating film 112 is preferably greater than or equal to 1 nm and less than or equal to 300 nm, more preferably greater than or equal to 5 nm and less than or equal to 50 nm.

The gate electrode 114 can be formed using a metal element selected from aluminum, chromium, copper, tantalum, titanium, molybdenum, and tungsten, an alloy containing any of these metal elements as a component, an alloy containing any of these metal elements in combination, or the like. Further, one or more metal elements selected from manganese and zirconium may be used. Furthermore, the gate electrode 114 may have a single-layer structure or a stacked-layer structure of two or more layers. For example, a single-layer structure of an aluminum film containing silicon, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film, a three-layer structure in which a titanium film, an aluminum film, and a titanium film are stacked in this order, and the like can be given.

Alternatively, a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added, can be used as the gate electrode 114. It is also possible to have a stacked-layer structure formed using the above light-transmitting conductive material and the above metal element.

As a material layer in contact with the gate insulating film 112, an In—Ga—Zn—O film containing nitrogen, an In—Sn—O film containing nitrogen, an In—Ga—O film containing nitrogen, an In—Zn—O film containing nitrogen, a Sn—O film containing nitrogen, an In—O film containing nitrogen, or a film of a metal nitride (such as InN or ZnN) is preferably provided between the gate electrode 114 and the gate insulating film 112. These films each have a work function of higher than or equal to 5 eV, preferably higher than or equal to 5.5 eV; thus, the threshold voltage in the electric characteristics of the transistor can be positive. Accordingly, a so-called normally-off switching element can be obtained. For example, in the case of using an In—Ga—Zn—O film containing nitrogen, an In—Ga—Zn—O film having a nitrogen concentration of higher than that of at least the oxide semiconductor film 140, specifically, an In—Ga—Zn—O film having a nitrogen concentration of higher than or equal to 7 at. % is used.

Figure 2B:
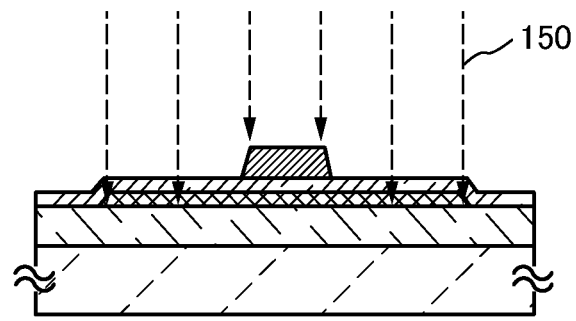
Figure 2C:
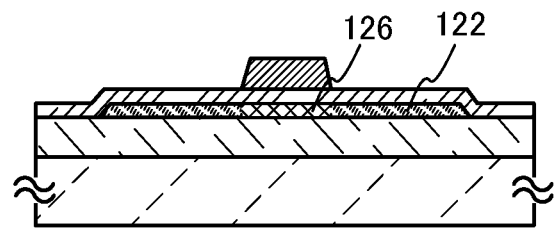

Next, as illustrated in FIG. 2B, ions 150 are added to the oxide semiconductor film 140.

As a method for adding the ions 150 to the oxide semiconductor film 140, an ion doping method or an ion implantation method can be used. When the ions 150 are added to the oxide semiconductor film covered with an insulating film or the like, the ions 150 can be selected from hydrogen and rare gases. When the ions are added to the exposed oxide semiconductor film, hydrogen can be used as the ions 150. By adding the ions 150 as illustrated in FIG. 2B, since the gate electrode 114 serves as a mask, the second oxide semiconductor regions 122 to which the ions 150 are added and the first oxide semiconductor region 126 to which the ions 150 are not added are formed in a self-aligned manner (see FIG. 2C).

In the second oxide semiconductor regions 122 to which the ions 150 are added, crystallinity is decreased owing to damage caused by addition of the ions; thus, the second oxide semiconductor regions 122 are amorphous regions. By adjusting the conditions for adding the ions such as the amount of the ions to be added, damage to the oxide semiconductor can be reduced, so that the second oxide semiconductor regions 122 which are not completely amorphous regions can be obtained. In that case, in the second oxide semiconductor regions 122, the proportion of an amorphous region is at least larger than that in the first oxide semiconductor region 126.

Other than an ion doping method, an ion implantation method, or the like, the ions 150 can be added to the oxide semiconductor film by a method in which ions are not implanted. For example, the ions can be added in the following manner: plasma is generated in an atmosphere of a gas containing an element to be added and plasma treatment is performed on an object to which the ions are added. A dry etching apparatus, a plasma CVD apparatus, a high-density plasma CVD apparatus, or the like can be used to generate the plasma.

In addition, heat treatment may be performed after the ions 150 are added. The heat treatment is preferably performed at a temperature at which the second oxide semiconductor regions 122 are not crystallized.

Figure 2D:
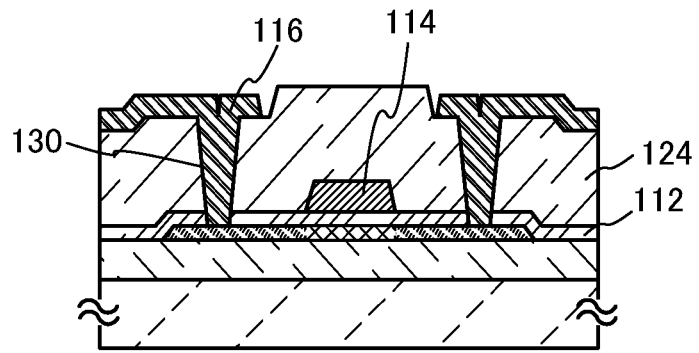

Next, as illustrated in FIG. 2D, the interlayer insulating film 124 is formed over the gate insulating film 112 and the gate electrode 114, and the contact holes 130 are provided in the interlayer insulating film 124. The wirings 116 connected to the pair of second oxide semiconductor regions 122 through the contact holes 130 are formed.

The interlayer insulating film 124 may be formed with a single layer or a stack using one or more of silicon oxide, silicon oxynitride, silicon nitride oxide, silicon nitride, aluminum oxide, and aluminum nitride by a sputtering method, a CVD method, or the like. At this time, it is preferable to use a material from which oxygen is less likely to be released by heating. This is for prevention against a decrease in the conductivity of the pair of second oxide semiconductor regions 122. Specifically, the interlayer insulating film 124 may be formed by a CVD method with the use of a mixture which contains a silane gas as a main material and a proper source gas selected from a nitrogen oxide gas, a nitrogen gas, a hydrogen gas, and a rare gas. In addition, the substrate temperature may be higher than or equal to 300° C. and lower than or equal to 550° C. By using a CVD method, the interlayer insulating film 124 can be formed using a material from which oxygen is less likely to be released by heating. Moreover, by using a silane gas as a main material, hydrogen remains in the film and diffusion of the hydrogen occurs; accordingly, the conductivity of the pair of second oxide semiconductor regions 122 can be further increased. The concentration of hydrogen in the interlayer insulating film 124 may be higher than or equal to 0.1 at. % and lower than or equal to 25 at. %.

The wirings 116 may be formed using a material similar to that for the gate electrode 114.

Through the above steps, a highly reliable transistor which includes an oxide semiconductor and has favorable electric characteristics even when the transistor is miniaturized and its channel length is reduced can be manufactured.

This embodiment can be combined with any of other embodiments as appropriate.

Embodiment 2

In this embodiment, an example of a transistor which is different from the transistor described in Embodiment 1 will be described with reference to FIG. 3 and FIGS. 4A to 4D.

Figure 3:
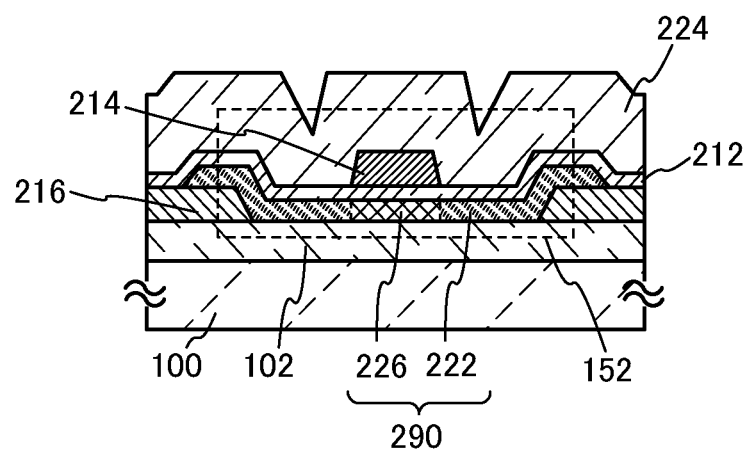
FIG. 3 is a cross-sectional view illustrating an example of a semiconductor device according to an embodiment of the present invention.

A transistor 152 illustrated in FIG. 3 includes a base insulating film 102 over a substrate 100, source and drain electrodes 216 over the base insulating film 102, an oxide semiconductor film 290 over the base insulating film 102 which includes a first oxide semiconductor region 226 and a pair of second oxide semiconductor regions 222 connected to the source and drain electrodes 216, a gate insulating film 212 over the oxide semiconductor film 290, a gate electrode 214 over the gate insulating film 212, and an interlayer insulating film 224 over the gate insulating film 212 and the gate electrode 214.

The channel length of the transistor is determined by the distance between the pair of second oxide semiconductor regions 222. The channel length is preferably equal to the width of the gate electrode 214 because the pair of second oxide semiconductor regions 222 and the gate electrode 214 do not overlap with each other in that case; however, the channel length does not need to be equal to the width of the gate electrode 214. For example, when the width of the gate electrode 214 is smaller than the channel length, a short-channel effect can be reduced owing to an effect of relieving concentration of an electric field.

<Example of Method for Manufacturing Transistor>

Next, a method for manufacturing the transistor illustrated in FIG. 3 will be described with reference to FIGS. 4A to 4D.

Figure 4A:
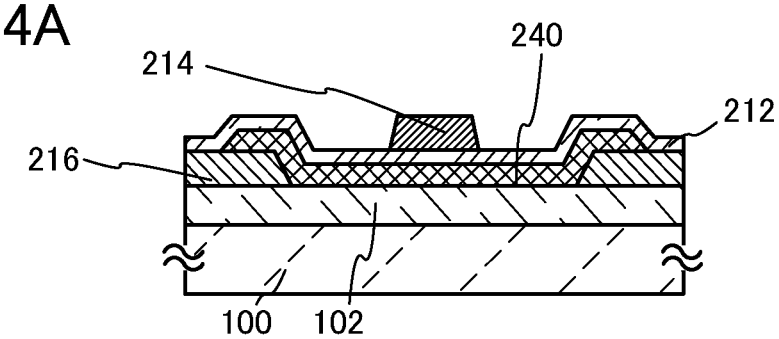
FIGS. 4A to 4D are cross-sectional views illustrating an example of a manufacturing process of a semiconductor device according to an embodiment of the present invention.

As illustrated in FIG. 4A, the base insulating film 102 is formed over the substrate 100.

Next, the source and drain electrodes 216 are formed over the base insulating film 102, and then, an oxide semiconductor film 240 is formed over the base insulating film 102 and the source and drain electrodes 216. The oxide semiconductor film 240 can be formed in a manner similar to that of the oxide semiconductor film 140 in Embodiment 1.

Next, the gate insulating film 212 is formed to cover the source and drain electrodes 216 and the oxide semiconductor film 240, and then, the gate electrode 214 is formed over the gate insulating film 212.

Figure 4B:
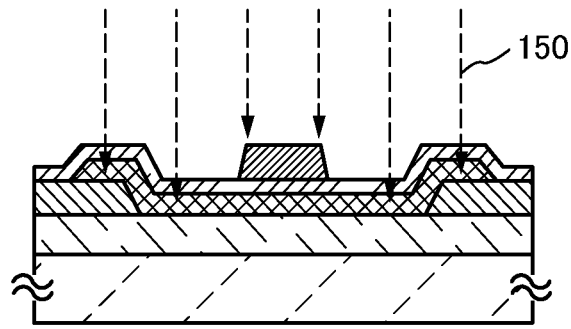
Figure 4C:
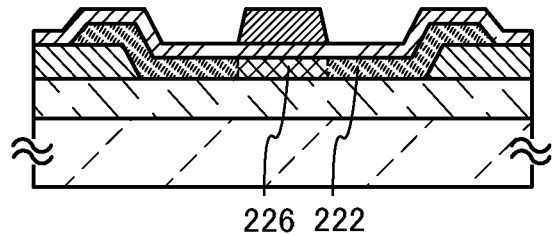

Next, as illustrated in FIG. 4B, ions 150 are added to the oxide semiconductor film 240. The ions 150 can be added in a manner similar to that in Embodiment 1. By adding the ions 150 using the gate electrode 214 as a mask, the second oxide semiconductor regions 222 to which the ions 150 are added and the first oxide semiconductor region 226 to which the ions 150 are not added can be formed in a self-aligned manner (see FIG. 4C).

Heat treatment may be performed after the ions 150 are added. The heat treatment is preferably performed at a temperature at which the second oxide semiconductor regions 222 are not crystallized.

Figure 4D:
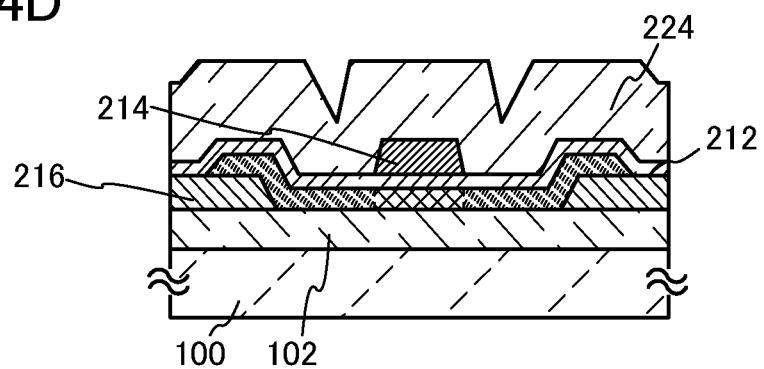

Next, as illustrated in FIG. 4D, the interlayer insulating film 224 is formed over the gate insulating film 212 and the gate electrode 214. Although not illustrated, contact holes may be provided in the interlayer insulating film 224 and wirings connected to the source and drain electrodes 216 through the contact holes may be formed.

Through the above steps, a highly reliable transistor which includes an oxide semiconductor and has favorable electric characteristics even when the transistor is miniaturized and its channel length is reduced can be manufactured.

This embodiment can be combined with any of other embodiments as appropriate.

Embodiment 3

In this embodiment, an example of a transistor which is different from the transistors described in Embodiments 1 and 2 will be described with reference to FIG. 5 and FIGS. 6A to 6D.

Figure 5:
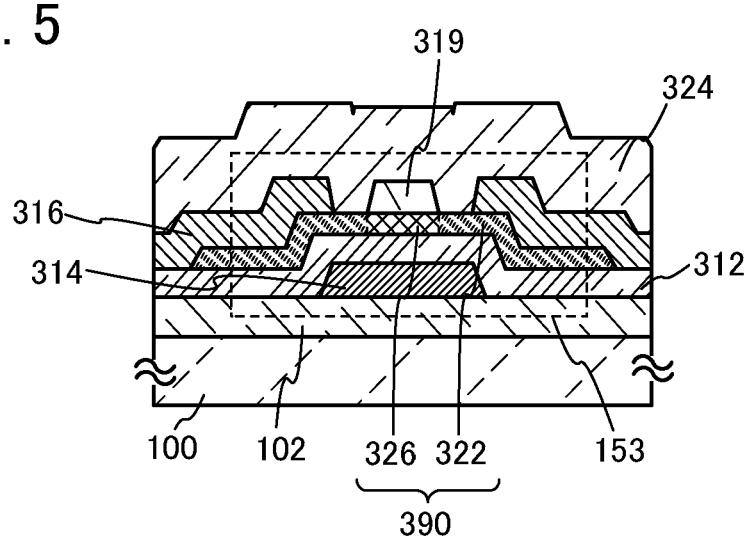
FIG. 5 is a cross-sectional view illustrating an example of a semiconductor device according to an embodiment of the present invention.

A transistor 153 illustrated in FIG. 5 includes a substrate 100 having an insulating surface, a gate electrode 314 over the substrate 100, a gate insulating film 312 over the gate electrode 314, an oxide semiconductor film 390 which is provided over the gate electrode 314 with the gate insulating film 312 interposed therebetween and includes a first oxide semiconductor region 326 and a pair of second oxide semiconductor regions 322, an insulating film 319 which is provided over and to overlap with the first oxide semiconductor region 326, source and drain electrodes 316 connected to the pair of second oxide semiconductor regions 322, and an interlayer insulating film 324 over the insulating film 319 and the source and drain electrodes 316. Note that a base insulating film 102 may be provided over the substrate 100.

The channel length of the transistor is determined by the distance between the pair of second oxide semiconductor regions 322. The channel length is preferably equal to the width of the gate electrode 314 because the pair of second oxide semiconductor regions 322 and the gate electrode 314 do not overlap with each other; however, the channel length does not need to be equal to the width of the gate electrode 314. For example, when the width of the gate electrode 314 is smaller than the channel length, a short-channel effect can be reduced owing to an effect of relieving concentration of an electric field.

<Example of Method for Manufacturing Transistor>

Next, a method for manufacturing the transistor illustrated in FIG. 5 will be described with reference to FIGS. 6A to 6D.

Figure 6A:
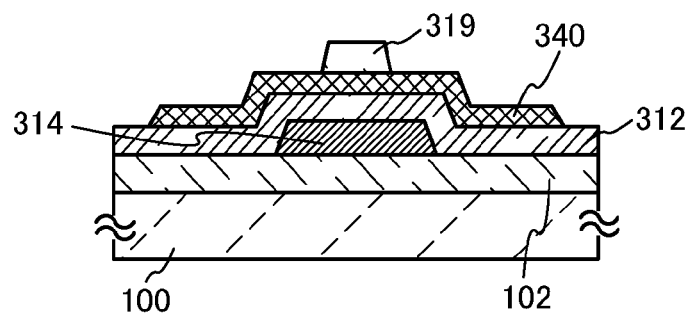
FIGS. 6A to 6D are cross-sectional views illustrating an example of a manufacturing process of a semiconductor device according to an embodiment of the present invention.

As illustrated in FIG. 6A, the base insulating film 102 is formed over the substrate 100.

Next, the gate electrode 314 is formed over the base insulating film 102, and the gate insulating film 312 is formed to cover the gate electrode 314.

Then, an oxide semiconductor film 340 is formed over the gate insulating film 312. The oxide semiconductor film 340 can be formed in a manner similar to that of the oxide semiconductor film 140 in Embodiment 1. After that, the insulating film 319 is formed over the oxide semiconductor film 340 to overlap with the gate electrode 314.

Figure 6B:
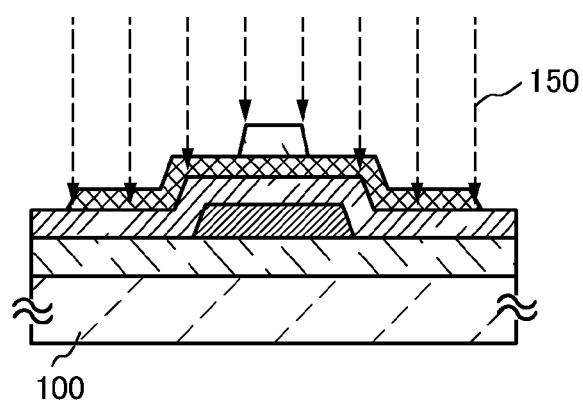
Figure 6C:
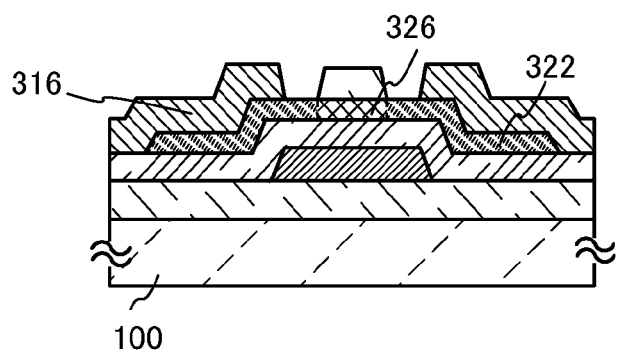

Next, as illustrated in FIG. 6B, ions 150 are added to the oxide semiconductor film 340. Hydrogen can be used as the ions 150. By adding the ions 150 using the insulating film 319 as a mask, the second oxide semiconductor regions 322 to which the ions 150 are added and the first oxide semiconductor region 326 to which the ions 150 are not added can be formed in a self-aligned manner. Then, the source and drain electrodes 316 are formed over the second oxide semiconductor regions 322 (see FIG. 6C).

Other than an ion doping method, an ion implantation method, or the like, the ions 150 can be added to the oxide semiconductor film by a method in which ions are not implanted. For example, the ions 150 can be added in the following manner: plasma is generated in an atmosphere of a gas containing an element to be added and plasma treatment is performed on an object to which the ions are added. A dry etching apparatus, a plasma CVD apparatus, a high-density plasma CVD apparatus, or the like can be used to generate the plasma.

Heat treatment may be performed after the ions 150 are added. The heat treatment is preferably performed at a temperature at which the second oxide semiconductor regions 322 are not crystallized.

Figure 6D:
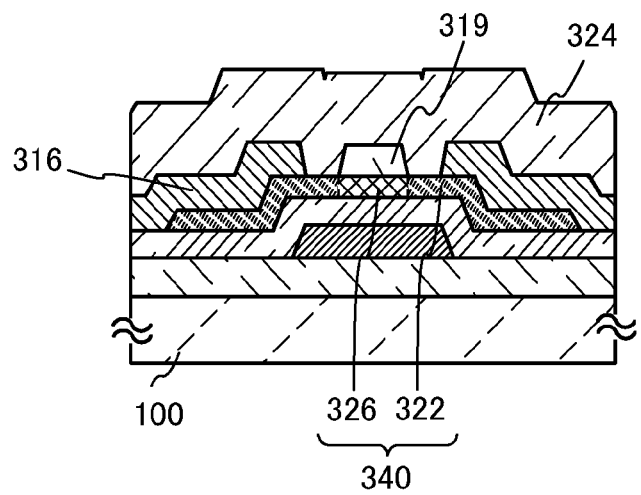

Next, as illustrated in FIG. 6D, the interlayer insulating film 324 is formed over the insulating film 319, the second oxide semiconductor regions 322, and the source and drain electrodes 316. Although not illustrated, contact holes may be formed in the interlayer insulating film 324, and wirings connected to the source and drain electrodes 316 through the contact holes may be formed.

Through the above steps, a highly reliable transistor which includes an oxide semiconductor and has favorable electric characteristics even when the transistor is miniaturized and its channel length is reduced can be manufactured.

This embodiment can be combined with any of other embodiments as appropriate.

Embodiment 4

In this embodiment, a resistor including an oxide semiconductor to which ions are added will be described with reference to FIGS. 7A and 7B.

Figure 7A:
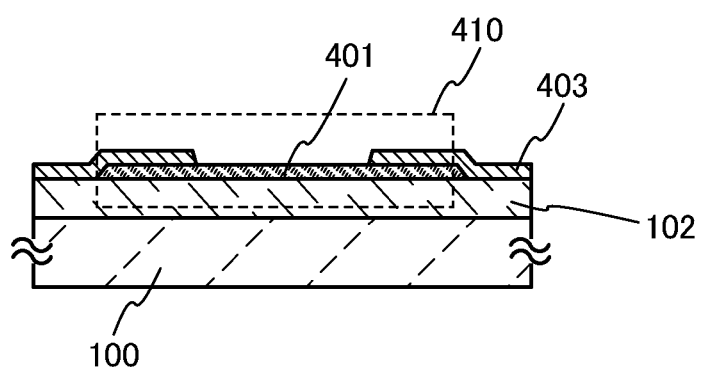
FIGS. 7A and 7B are cross-sectional views each illustrating an example of a semiconductor device according to an embodiment of the present invention.

FIG. 7A illustrates a resistor 410. The resistor 410 includes a substrate 100 having an insulating surface, an oxide semiconductor film 401 which is provided over the substrate 100, to which ions are added, and which is used for resistance, and conductive films 403 provided in contact with the oxide semiconductor film 401. The oxide semiconductor film 401 to which ions are added can be formed in a manner similar to that of the second oxide semiconductor regions 222 described in Embodiment 2. The conductive films 403 can be formed using a material similar to that for the source and drain electrodes 216. In addition, a base insulating film 102 is formed over the substrate 100.

Figure 7B:
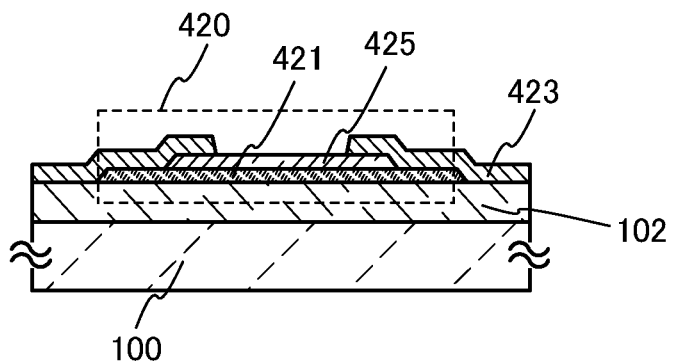

FIG. 7B illustrates a resistor 420. The resistor 420 includes a substrate 100 having an insulating surface, an oxide semiconductor film 421 which is provided over the substrate 100, to which ions are added, and which is used for resistance, an insulating film 425 in contact with the oxide semiconductor film 421, and conductive films 423 provided in contact with part of the insulating film 425 and part of the oxide semiconductor film 421. The oxide semiconductor film 421 to which ions are added can be formed in a manner similar to that of the second oxide semiconductor regions 222 described in Embodiment 2. The insulating film 425 can be formed using a material similar to that for the gate insulating film 212. The conductive films 423 can be formed using a material similar to that for the source and drain electrodes 216. By forming the resistor 420 in this manner, the distance between the conductive films in the resistor can be constant, and the resistance value of the resistor can be more precise. In addition, a base insulating film 102 is formed over the substrate 100 in this embodiment.

Embodiment 5

In this embodiment, a method for forming an oxide semiconductor film which is a CAAC-OS film, other than the method used in Embodiments 1 to 4, will be described.

First, a first oxide semiconductor film is formed in contact with an insulating film over a substrate. The thickness of the first oxide semiconductor film is greater than or equal to a thickness of one atomic layer and less than or equal to 10 nm, preferably greater than or equal to 2 nm and less than or equal to 5 nm.

When the first oxide semiconductor film is formed, the substrate temperature is higher than or equal to 150° C. and lower than or equal to 450° C., preferably higher than or equal to 200° C. and lower than or equal to 350° C. Accordingly, entry of impurities such as moisture (including hydrogen) to be contained in the first oxide semiconductor film can be reduced. Further, the crystallinity of the first oxide semiconductor film can be improved, so that an oxide semiconductor film which is a CAAC-OS film can be formed.

After formation of the first oxide semiconductor film, first heat treatment may be performed. Through the first heat treatment, moisture (including hydrogen) can be removed from the first oxide semiconductor film, and the crystallinity thereof can be further improved. By performing the first heat treatment, a CAAC-OS film with higher crystallinity can be formed. The first heat treatment is performed at a temperature of higher than or equal to 200° C. and lower than the strain point of the substrate, preferably higher than or equal to 250° C. and lower than or equal to 450° C.

For the first heat treatment, a rapid thermal annealing (RTA) apparatus can be used. With the use of an RTA apparatus, heat treatment can be performed at a temperature of higher than or equal to the strain point of the substrate if the heating time is short. Therefore, time to form an oxide semiconductor film in which the proportion of a crystalline region is higher than that of an amorphous region can be shortened.

The first heat treatment can be performed in an inert gas atmosphere; preferably, in a rare gas (such as helium, neon, argon, xenon, or krypton) atmosphere or a nitrogen atmosphere. Alternatively, the heat treatment may be performed in an oxygen atmosphere or a reduced pressure atmosphere. The heating time is 3 minutes to 24 hours. As the treatment time is increased, the proportion of a crystalline region with respect to that of an amorphous region in the oxide semiconductor film can be increased. Note that heat treatment for longer than 24 hours is not preferable because the productivity is reduced.

Next, a second oxide semiconductor film is formed over the first oxide semiconductor film, so that a stack of oxide semiconductors is formed. The second oxide semiconductor film can be formed by a method similar to that for the first oxide semiconductor film.

When the substrate is heated while the second oxide semiconductor film is formed, the second oxide semiconductor film can be crystallized with the use of the first oxide semiconductor film as a seed crystal. At this time, to compose the first oxide semiconductor film and the second oxide semiconductor film using the same kind of element is referred to as "homoepitaxial growth". Alternatively, to compose the first oxide semiconductor film and the second oxide semiconductor film using elements, at least one kind of which differs between the first oxide semiconductor film and the second oxide semiconductor film, is referred to as "heteroepitaxial growth".

After formation of the second oxide semiconductor film, second heat treatment may be performed. The second heat treatment may be performed in a manner similar to that of the first heat treatment. With the second heat treatment, a stack of oxide semiconductors in which the proportion of a crystalline region with respect to an amorphous region is high can be obtained. Further, with the second heat treatment, the second oxide semiconductor film can be crystallized with the use of the first oxide semiconductor film as a seed crystal. At this time, "homoepitaxial growth" in which the first oxide semiconductor film and the second oxide semiconductor film are composed of the same element may be caused. Alternatively, "heteroepitaxial growth" in which the first oxide semiconductor film and the second oxide semiconductor film are composed of elements, at least one kind of which differs between the first oxide semiconductor film and the second oxide semiconductor film, may be caused.

Through the above steps, an oxide semiconductor film which is a CAAC-OS film can be formed.

Embodiment 6

In this embodiment, an influence on the electric characteristics of the transistor including an oxide semiconductor film described in any of Embodiments 1 to 3 will be described with reference to band diagrams.

Figure 8:
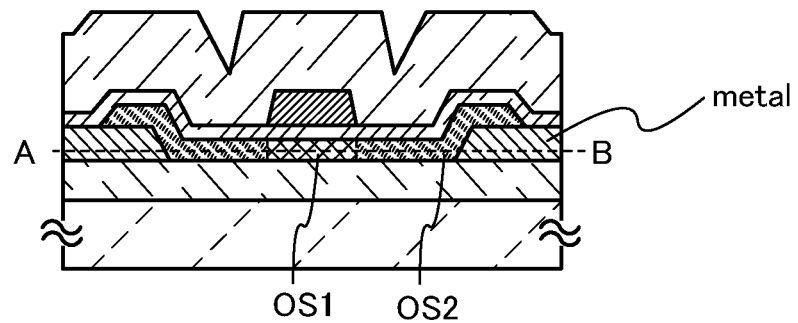
FIG. 8 is a cross-sectional view illustrating an example of a semiconductor device according to an embodiment of the present invention.
Figure 9A:
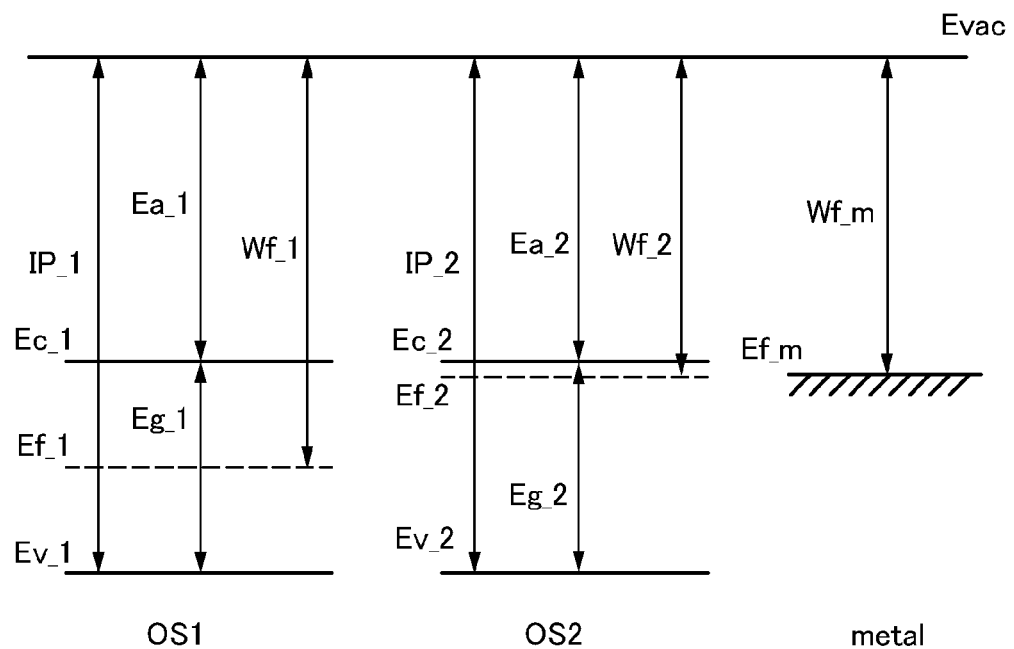
FIGS. 9A and 9B each illustrate a band structure of an oxide semiconductor and a metal material.
Figure 9B:
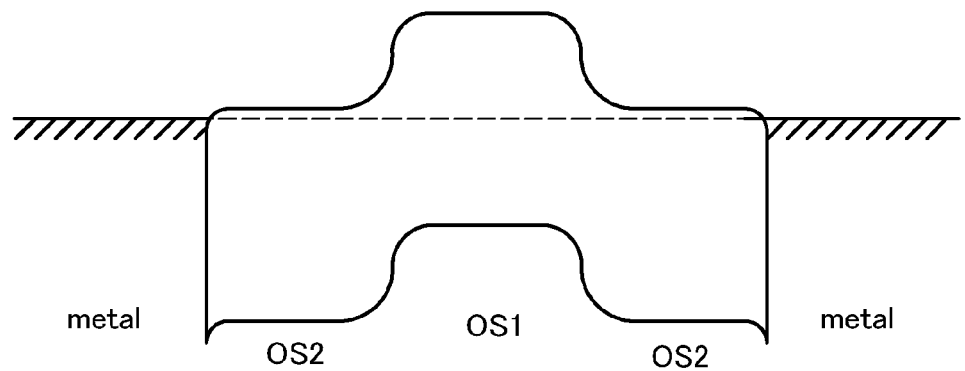

FIGS. 9A and 9B are energy band diagrams (schematic diagrams) of cross section A-B of a transistor illustrated in FIG. 8. FIG. 8 illustrates a structure that is the same as or similar to that in FIG. 3 of Embodiment 2. FIG. 9B shows the case where a voltage of a source and a voltage of a drain are equal to each other (Vd=0V). FIG. 8 illustrates the transistor provided with an oxide semiconductor film including a first oxide semiconductor region (OS1) and a pair of second oxide semiconductor regions (OS2) and source and drain electrodes (metal).

In FIG. 8, a channel of the transistor is formed using OS1. OS1 is an oxide semiconductor which is made to be intrinsic (i-type) or as close to intrinsic as possible by highly purifying the film through removal or elimination of impurities such as moisture (including hydrogen) as much as possible. Thus, the Fermi level (Ef) can be the same as the intrinsic Fermi level (Ei).

In addition, in FIG. 8, a source region and a drain region of the transistor are formed using the pair of OS2. OS2 is formed in such a manner that an oxide semiconductor is made to be intrinsic (i-type) or as close to intrinsic as possible as in the case of OS1 by highly purifying the film through removal or elimination of impurities such as moisture (including hydrogen) as much as possible, and after that, ions of at least one of hydrogen and rare gases are added to generate a donor or oxygen deficiency. OS2 has thus higher carrier density than OS1 and the position of its Fermi level is close to the conduction band.

FIG. 9A shows a relation of band structures of the vacuum level (Evac), the first oxide semiconductor region (OS1), the second oxide semiconductor region (OS2), and the source and drain electrodes (metal). Here, IP represents the ionization potential; Ea, the electron affinity; Eg, the band gap; and Wf, the work function. In addition, Ec represents the bottom of the conduction band; Ev, the top of the valence band; and Ef, the Fermi level. As for a sign at the end of each symbol, 1 denotes OS1; 2, OS 2; and m, metal. Here, a metal material having Wf_m of 4.1 eV (such as titanium) is assumed as the metal.

OS1 is a highly purified oxide semiconductor and thus has extremely low carrier density; therefore, Ef_1 is around the middle point between Ec and Ev. OS2 is an n-type oxide semiconductor having high carrier density, and thus Ec_2 substantially corresponds to Ef_2. It is said that the band gap (Eg) of the oxide semiconductors denoted by OS1 and OS2 is 3.15 eV and the electron affinity (Ea) thereof is 4.3 eV.

As shown in FIG. 9B, in the case where OS1 that is the channel and OS2 that is the source or drain region are in contact with each other, transfer of carriers occurs so that the Fermi levels can be equal to each other; thus, the band edges of OS1 and OS2 curve. Further, in the case where OS2 is in contact with the metal that is the source or drain electrode, transfer of carriers occurs so that the Fermi levels can be equal to each other; thus, the band edge of OS2 curves.

By forming OS2 that is an n-type oxide semiconductor between OS1 that is the channel and the metal that is the source or drain electrode, contact between the oxide semiconductor and the metal can be an ohmic junction, and contact resistance can be reduced. As a result, the on-state current of the transistor can be increased. Furthermore, the degree of the curve of the band edge can be small as for OS1, so that a short-channel effect of the transistor can be reduced.

Embodiment 7

Figure 10A:
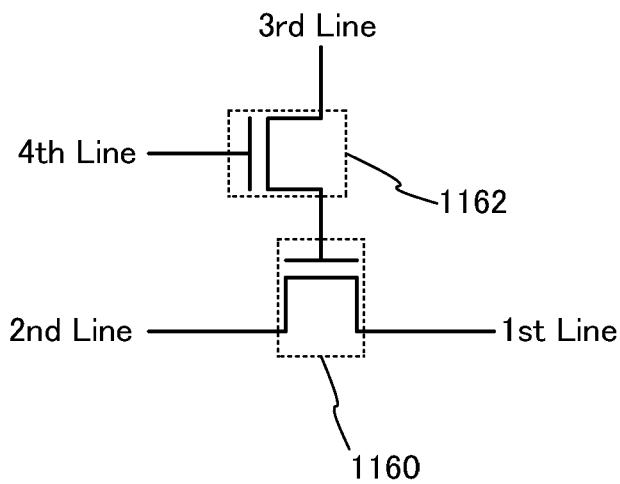
FIGS. 10A and 10B are examples of a circuit diagram illustrating an embodiment of the present invention.

An example of a circuit diagram of a memory element (hereinafter also referred to as a memory cell) included in a semiconductor device is illustrated in FIG. 10A. The memory cell includes a transistor 1160 in which a channel formation region is formed using a material other than an oxide semiconductor and a transistor 1162 in which a channel formation region is formed using an oxide semiconductor.

The transistor 1162 in which the channel formation region is formed using an oxide semiconductor can be manufactured in accordance with Embodiments 1 and 2.

As illustrated in FIG. 10A, a gate electrode of the transistor 1160 is electrically connected to one of a source electrode and a drain electrode of the transistor 1162. A first wiring (a 1st line, also referred to as a source line) is electrically connected to a source electrode of the transistor 1160. A second wiring (a 2nd line, also referred to as a bit line) is electrically connected to a drain electrode of the transistor 1160. A third wiring (a 3rd line, also referred to as a first signal line) is electrically connected to the other of the source electrode and the drain electrode of the transistor 1162. A fourth wiring (a 4th line, also referred to as a second signal line) is electrically connected to a gate electrode of the transistor 1162.

The transistor 1160 in which the channel formation region is formed using a material other than an oxide semiconductor, e.g., single crystal silicon can operate at sufficiently high speed. Therefore, with the use of the transistor 1160, high-speed reading of stored contents and the like are possible. The transistor 1162 in which the channel formation region is formed using an oxide semiconductor is characterized by its off-state current which is smaller than the off-state current of the transistor 1160. Therefore, when the transistor 1162 is turned off, a potential of the gate electrode of the transistor 1160 can be held for a very long time.

By utilizing a characteristic in which the potential of the gate electrode of the transistor 1160 can be held, writing, holding, and reading of data are possible as described below.

First, writing and holding of data are described. First, a potential of the fourth wiring is set to a potential at which the transistor 1162 is turned on, so that the transistor 1162 is turned on. Thus, a potential of the third wiring is supplied to the gate electrode of the transistor 1160 (writing). After that, the potential of the fourth wiring is set to a potential at which the transistor 1162 is turned off, so that the transistor 1162 is turned off, and thus, the potential of the gate electrode of the transistor 1160 is held (holding).

Since the off-state current of the transistor 1162 is smaller than the off-state current of the transistor 1160, the potential of the gate electrode of the transistor 1160 is held for a long time. For example, when the potential of the gate electrode of the transistor 1160 is a potential at which the transistor 1160 is in an on state, the on state of the transistor 1160 is held for a long time. In addition, when the potential of the gate electrode of the transistor 1160 is a potential at which the transistor 1160 is an off state, the off state of the transistor 1160 is held for a long time.

Then, reading of data is described. When a predetermined potential (a low potential) is supplied to the first wiring in a state where the on state or the off state of the transistor 1160 is held as described above, a potential of the second wiring varies depending on the on state or the off state of the transistor 1160. For example, when the transistor 1160 is in the on state, the potential of the second wiring becomes lower than the potential of the first wiring. On the other hand, when the transistor 1160 is in the off state, the potential of the second wiring does not vary.

In such a manner, the potential of the second wiring and a predetermined potential are compared with each other in a state where data is held, whereby the data can be read out.

Then, rewriting of data is described. Rewriting of data is performed in a manner similar to that of the writing and holding of data. That is, the potential of the fourth wiring is set to a potential at which the transistor 1162 is turned on, so that the transistor 1162 is turned on. Thus, the potential of the third wiring (a potential for new data) is supplied to the gate electrode of the transistor 1160. After that, the potential of the fourth wiring is set to a potential at which the transistor 1162 is turned off, so that the transistor 1162 is turned off, and thus, the new data is held.

In the memory cell according to the disclosed invention, data can be directly rewritten by another writing of data as described above. For that reason, an erasing operation which is necessary for a flash memory or the like is not needed, so that a reduction in operation speed because of an erasing operation can be suppressed. In other words, a high-speed operation of the semiconductor device including the memory cell can be realized.

Figure 10B:
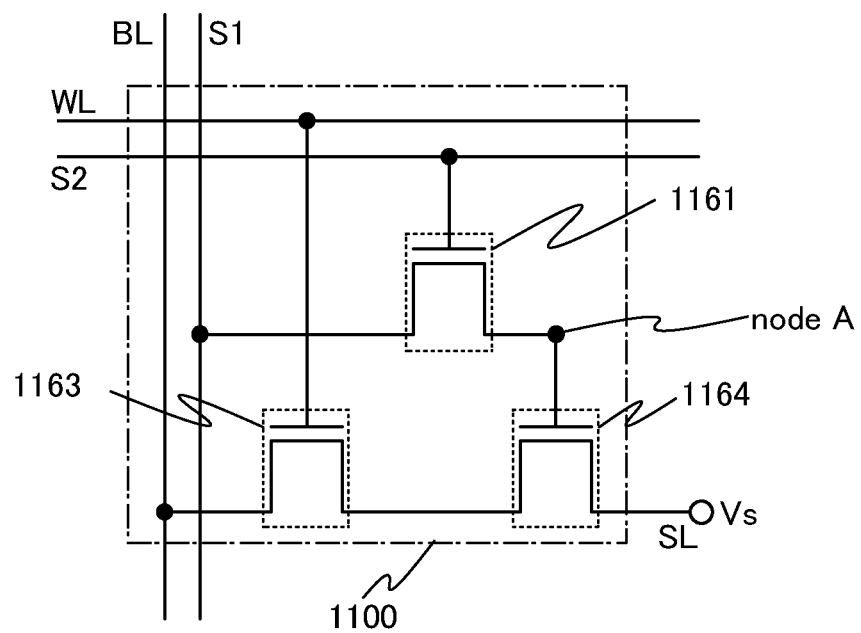

FIG. 10B is a circuit diagram illustrating an application example of the memory cell illustrated in FIG. 10A.

A memory cell 1100 illustrated in FIG. 10B includes a first wiring SL (a source line), a second wiring BL (a bit line), a third wiring S1 (a first signal line), a fourth wiring S2 (a second signal line), a fifth wiring WL (a word line), a transistor 1164 (a first transistor), a transistor 1161 (a second transistor), and a transistor 1163 (a third transistor). In each of the transistors 1164 and 1163, a channel formation region is formed using a material other than an oxide semiconductor, and in the transistor 1161, a channel formation region is formed using an oxide semiconductor.

Here, a gate electrode of the transistor 1164 is electrically connected to one of a source electrode and a drain electrode of the transistor 1161. In addition, the first wiring SL is electrically connected to a source electrode of the transistor 1164, and a drain electrode of the transistor 1164 is electrically connected to a source electrode of the transistor 1163. The second wiring BL is electrically connected to a drain electrode of the transistor 1163, and the third wiring S1 is electrically connected to the other of the source electrode and the drain electrode of the transistor 1161. The fourth wiring S2 is electrically connected to a gate electrode of the transistor 1161, and the fifth wiring WL is electrically connected to a gate electrode of the transistor 1163.

Next, an operation of the circuit is specifically described.

When data is written into the memory cell 1100, the first wiring SL is set to 0 V, the fifth wiring WL is set to 0 V, the second wiring BL is set to 0 V, and the fourth wiring S2 is set to 2 V. The third wiring S1 is set to 2 V in order to write data "1" and set to 0 V in order to write data "0". At this time, the transistor 1163 is in an off state and the transistor 1161 is in an on state. Note that at the end of the writing, before the potential of the third wiring S1 is changed, the fourth wiring S2 is set to 0 V so that the transistor 1161 is turned off.

As a result, a potential of a node (referred to as a node A) connected to the gate electrode of the transistor 1164 is set to approximately 2 V after the writing of the data "1" and set to approximately 0 V after the writing of the data "0". Electric charge corresponding to a potential of the third wiring S1 is accumulated at the node A; since the off-state current of the transistor 1161 is smaller than that of a transistor in which a channel formation region is formed using single crystal silicon, the potential of the gate electrode of the transistor 1164 is held for a long time.

When data is read from the memory cell, the first wiring SL is set to 0 V, the fifth wiring WL is set to 2 V, the fourth wiring S2 and the third wiring S1 are set to 0 V, and a reading circuit connected to the second wiring BL is operated. At this time, the transistor 1163 is in an on state and the transistor 1161 is in an off state.

The transistor 1164 is in an off state in the case of the data "0", that is, where the node A is set to approximately 0 V, so that the resistance between the second wiring BL and the first wiring SL is high. On the other hand, the transistor 1164 is in an on state in the case of the data "1", that is, where the node A is set to approximately 2 V, so that the resistance between the second wiring BL and the first wiring SL is low. A reading circuit can read the data "0" or the data "1" in accordance with the difference in resistance state of the memory cell. The second wiring BL at the time of the writing is set to 0 V; however, it may be in a floating state or may be charged to have a potential higher than 0 V. The third wiring S1 at the time of the reading is set to 0 V; however, it may be in a floating state or may be charged to have a potential higher than 0 V.

Note that the data "1" and the data "0" are defined for convenience and can be reversed. In addition, the above operation voltages are examples. The operation voltages are set so that the transistor 1164 is turned off in the case of data "0" and turned on in the case of data "1", the transistor 1161 is turned on at the time of writing and turned off in periods except the time of writing, and the transistor 1163 is turned on at the time of reading. In particular, a power supply potential VDD of a peripheral logic circuit may also be used instead of 2 V.

In this embodiment, the memory cell with a minimum storage unit (one bit) is described for easy understanding; however, the structure of the memory cell is not limited thereto. It is also possible to make a more developed semiconductor device with a plurality of memory cells connected to each other as appropriate. For example, it is possible to make a NAND-type or NOR-type semiconductor device by using more than one of the above memory cells. The wiring structure is not limited to that in FIG. 10A or 10B and can be changed as appropriate.

Figure 11:
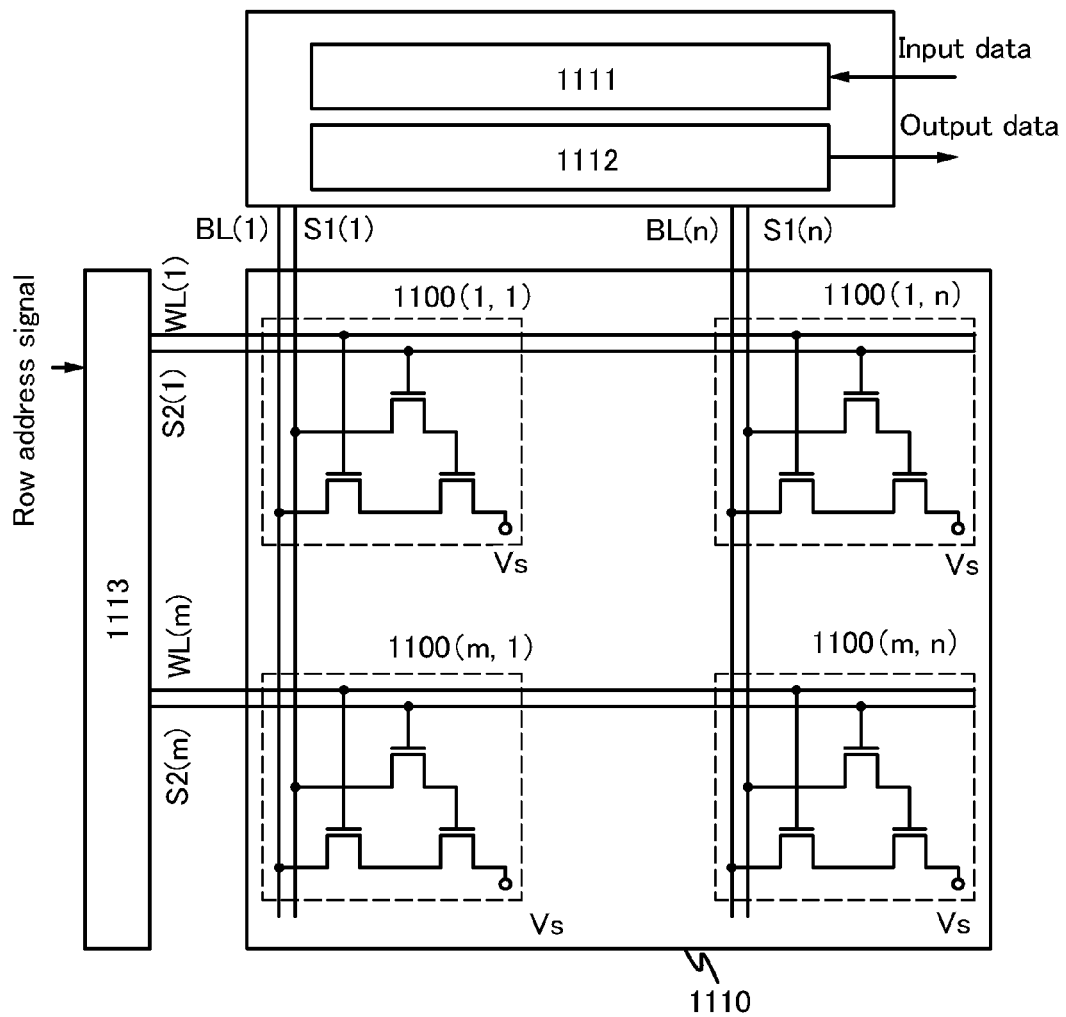
FIG. 11 is an example of a circuit diagram illustrating an embodiment of the present invention.

FIG. 11 is a block circuit diagram of a semiconductor device according to an embodiment of the present invention. The semiconductor device includes m×n bits of memory capacity.

The semiconductor device illustrated in FIG. 11 includes m fourth wirings, m fifth wirings, n second wirings, n third wirings, a memory cell array 1110 in which a plurality of memory cells 1100(1,1) to 1100(m,n) are arranged in a matrix of m rows by n columns (m and n are each a natural number), and peripheral circuits such as a circuit 1111 for driving the second wirings and the third wirings, a circuit 1113 for driving the fourth wirings and the fifth wirings, and a reading circuit 1112. A refresh circuit or the like may be provided as another peripheral circuit.

A memory cell 1100(i,j) is considered as a typical example of the memory cell. Here, the memory cell 1100(i,j) is an integer of greater than or equal to 1 and less than or equal to m and j is an integer of greater than or equal to 1 and less than or equal to n) is connected to a second wiring BL(j), a third wiring S1(j), a fourth wiring S2(i), a fifth wiring WL(i), and a first wiring. A first wiring potential Vs is supplied to the first wiring. The second wirings BL(1) to BL(n) and the third wirings S1(1) to S1(n) are connected to the circuit 1111 for driving the second wirings and the third wirings and the reading circuit 1112. The fifth wirings WL(1) to WL(m) and the fourth wirings S2(1) to S2(m) are connected to the circuit 1113 for driving the fourth wirings and the fifth wirings.

The operation of the semiconductor device illustrated in FIG. 11 is described. In this structure, data is written and read per row.

When data is written into memory cells 1100(i,1) to 1100(i,n) of an i-th row, the first wiring potential Vs is set to 0 V, a fifth wiring WL(i) and the second wirings BL(1) to BL(n) are set to 0 V, and a fourth wiring S2(i) is set to 2 V. At this time, the transistors 1161 are turned on. Among the third wirings S1(1) to S1(n), the third wiring in a column in which data "1" is to be written is set to 2 V and the third wiring in a column in which data "0" is to be written is set to 0 V. Note that, to finish writing, the fourth wiring S2(i) is set to 0 V before the potentials of the third wirings S1(1) to S1(n) are changed, so that the transistors 1161 are turned off. Moreover, a non-selected fifth wiring WL and a non-selected fourth wiring S2 are set to 0 V.

As a result, the potential of the node (referred to as the node A) connected to the gate electrode of the transistor 1164 in the memory cell into which data "1" has been written is set to approximately 2 V, and the potential of the node A in the memory cell into which data "0" has been written is set to approximately 0 V. The potential of the node A of the non-selected memory cell is not changed.

When data is read from the memory cells 1100(i,1) to 1100(i,n) of the i-th row, the first wiring potential Vs is set to 0 V, the fifth wiring WL(i) is set to 2 V, the fourth wiring S2(i) and the third wirings S1(1) to S1(n) are set to 0 V, and the reading circuit connected to the second wirings BL(1) to BL(n) is operated. The reading circuit can read data "0" or data "1" in accordance with the difference in resistance state of the memory cell, for example. Note that the non-selected fifth wiring WL and the non-selected fourth wiring are set to 0 V. The second wiring BL at the time of the writing is set to 0 V; however, it may be in a floating state or may be charged to have a potential higher than 0 V. The third wiring S1 at the time of the reading is set to 0 V; however, it may be in a floating state or may be charged to have a potential higher than 0V.

Note that the data "1" and the data "0" are defined for convenience and can be reversed. In addition, the above operation voltages are examples. The operation voltages are set so that the transistor 1164 is turned off in the case of data "0" and turned on in the case of data "1", the transistor 1161 is turned on at the time of writing and turned off in periods except the time of writing, and the transistor 1163 is turned on at the time of reading. A power supply potential VDD of a peripheral logic circuit may also be used instead of 2 V.

Embodiment 8

Figure 12A:
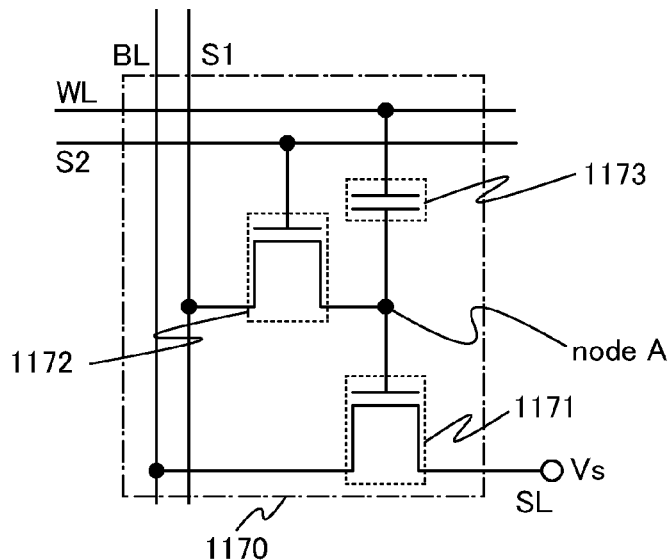
FIGS. 12A and 12B are examples of a circuit diagram illustrating an embodiment of the present invention.

In this embodiment, an example of a circuit diagram of a memory cell including a capacitor will be described. A memory cell 1170 illustrated in FIG. 12A includes a first wiring SL, a second wiring BL, a third wiring S1, a fourth wiring S2, a fifth wiring WL, a transistor 1171 (a first transistor), a transistor 1172 (a second transistor), and a capacitor 1173. In the transistor 1171, a channel formation region is formed using a material other than an oxide semiconductor, and in the transistor 1172, a channel formation region is formed using an oxide semiconductor.

Here, a gate electrode of the transistor 1171, one of a source electrode and a drain electrode of the transistor 1172, and one electrode of the capacitor 1173 are electrically connected to each other. In addition, the first wiring SL is electrically connected to a source electrode of the transistor 1171. The second wiring BL is electrically connected to a drain electrode of the transistor 1171. The third wiring S1 is electrically connected to the other of the source electrode and the drain electrode of the transistor 1172. The fourth wiring S2 is electrically connected to a gate electrode of the transistor 1172. The fifth wiring WL is electrically connected to the other electrode of the capacitor 1173.

Next, an operation of the circuit will be specifically described.

When data is written into the memory cell 1170, the first wiring SL is set to 0 V, the fifth wiring WL is set to 0 V, the second wiring BL is set to 0 V, and the fourth wiring S2 is set to 2 V. The third wiring S1 is set to 2 V in order to write data "1" and set to 0 V in order to write data "0". At this time, the transistor 1172 is turned on. Note that, to finish writing, the fourth wiring S2 is supplied with 0 V before the potential of the third wiring S1 is changed, so that the transistor 1172 is turned off.

As a result, the potential of a node (referred to as a node A) connected to the gate electrode of the transistor 1171 is set to approximately 2 V after the writing of the data "1" and is set to approximately 0 V after the writing of the data "0".

When data is read from the memory cell 1170, the first wiring SL is set to 0 V, the fifth wiring WL is set to 2 V, the fourth wiring S2 is set to 0 V, the third wiring S1 is set to 0 V, and a reading circuit connected to the second wiring BL is operated. At this time, the transistor 1172 is turned off.

The state of the transistor 1171 in the case where the fifth wiring WL is set to 2 V will be described. The potential of the node A which determines the state of the transistor 1171 depends on capacitance C1 between the fifth wiring WL and the node A, and capacitance C2 between the gate electrode of the transistor 1171 and the source and drain electrodes of the transistor 1171.

Note that the third wiring S1 at the time of reading is set to 0 V; however, the third wiring S1 may be in a floating state or may be charged to have a potential higher than 0 V. The data "1" and the data "0" are defined for convenience and may be reversed.

The potential of the third wiring S1 at the time of writing may be selected from the potentials of the data "0" and the data "1" so that the transistor 1172 is turned off after the writing and the transistor 1171 is turned off in the case where the potential of the fifth wiring WL is set to 0 V. The potential of the fifth wiring WL at the time of reading may be selected so that the transistor 1171 is turned off in the case of the data "0" and is turned on in the case of the data "1". Furthermore, the threshold voltage of the transistor 1171 is an example. The transistor 1171 can have any threshold voltage as long as the transistor 1171 operates in the above-described manner.

An example of a NOR-type semiconductor memory device in which a memory cell including a capacitor and a selection transistor having a first gate electrode and a second gate electrode is used will be described with reference to FIG. 12B.

Figure 12B:
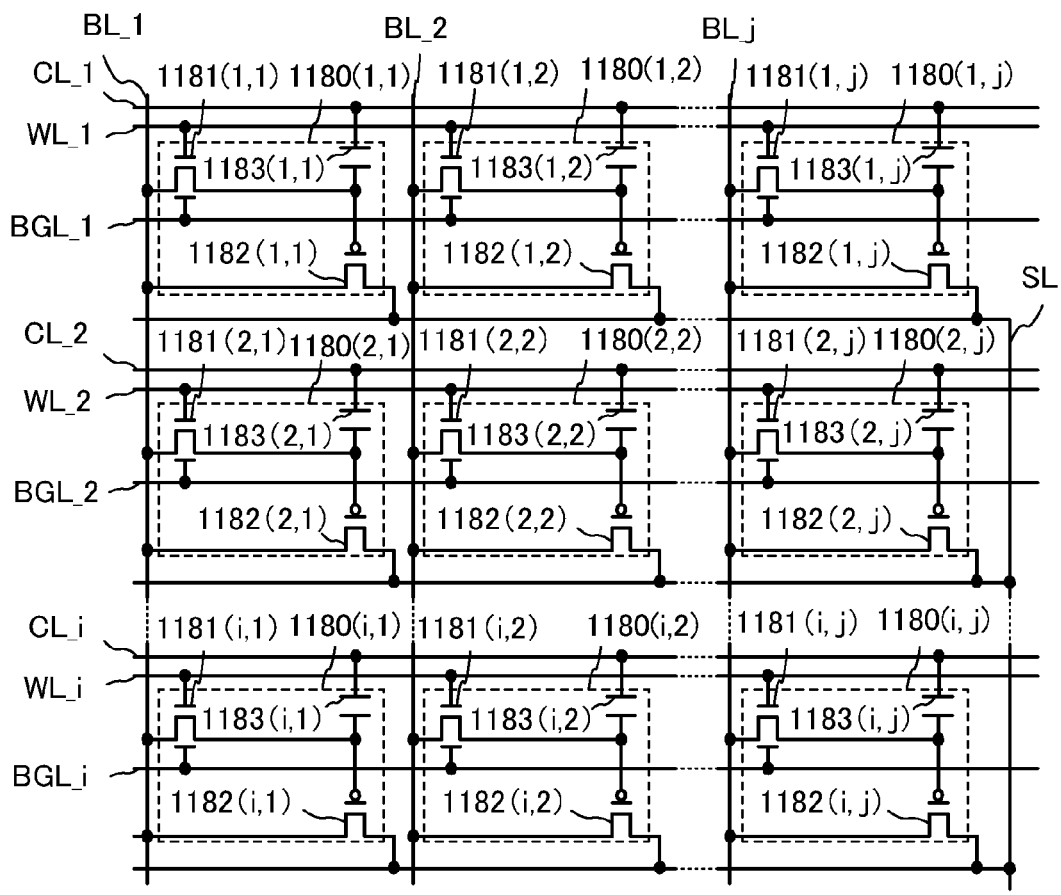

A semiconductor device illustrated in FIG. 12B according to an embodiment of the present invention includes a memory cell array including a plurality of memory cells arranged in a matrix of i rows (i is a natural number of greater than or equal to 2) by j columns (j is a natural number).

The memory cell array illustrated in FIG. 12B includes a plurality of memory cells 1180 arranged in a matrix of i rows (i is a natural number of greater than or equal to 3) by j columns (j is a natural number of greater than or equal to 3), i word lines WL (word lines WL_1 to WL_i), i capacitor lines CL (capacitor lines CL_1 to CL_i), i gate lines BGL (gate lines BGL_1 to BGL_i), j bit lines BL (bit lines BL_1 to BL_j), and a source line SL.

Further, each of the plurality of memory cells 1180 (also referred to as a memory cell 1180(M,N) (note that N is a natural number of greater than or equal to 1 and less than or equal to j and M is a natural number of greater than or equal to 1 and less than or equal to i)) includes a transistor 1181(M,N), a capacitor 1183(M,N), and a transistor 1182(M,N).

Note that in the semiconductor memory device, the capacitor includes a first capacitor electrode, a second capacitor electrode, and a dielectric layer overlapping with the first capacitor electrode and the second capacitor electrode. Electric charge is accumulated in the capacitor in accordance with a voltage applied between the first capacitor electrode and the second capacitor electrode.

The transistor 1181(M,N) is an n-channel transistor which has a source electrode, a drain electrode, a first gate electrode, and a second gate electrode. Note that in the semiconductor memory device in this embodiment, the transistor 1181 is not necessarily an n-channel transistor.

One of the source electrode and the drain electrode of the transistor 1181(M,N) is connected to the bit line BL_N. The first gate electrode of the transistor 1181(M,N) is connected to the word line WL_M The second gate electrode of the transistor 1181(M,N) is connected to the gate line BGL_M. With the structure in which the one of the source electrode and the drain electrode of the transistor 1181(M,N) is connected to the bit line BL_N, data can be selectively read from the memory cells.

The transistor 1181(M,N) serves as a selection transistor in the memory cell 1180(M,N).

As the transistor 1181(M,N), a transistor in which a channel formation region is formed using an oxide semiconductor can be used.

The transistor 1182(M,N) is a p-channel transistor. Note that in the semiconductor memory device in this embodiment, the transistor 1182 is not necessarily a p-channel transistor.

One of a source electrode and a drain electrode of the transistor 1182(M,N) is connected to the source line SL. The other of the source electrode and the drain electrode of the transistor 1182(M,N) is connected to the bit line BL_N. A gate electrode of the transistor 1182(M,N) is connected to the other of the source electrode and the drain electrode of the transistor 1181(M,N).

The transistor 1182(M,N) serves as an output transistor in the memory cell 1180(M,N). As the transistor 1182(M,N), for example, a transistor in which a channel formation region is formed using single crystal silicon can be used.

A first capacitor electrode of the capacitor 1183(M,N) is connected to the capacitor line CL_M. A second capacitor electrode of the capacitor 1183(M,N) is connected to the other of the source electrode and the drain electrode of the transistor 1181(M,N). Note that the capacitor 1183(M,N) serves as a storage capacitor.

The voltage of the word lines WL_1 to WL_i is controlled by, for example, a driver circuit including a decoder.

The voltage of the bit lines BL_1 to BL_j is controlled by, for example, a driver circuit including a decoder.

The voltage of the capacitor lines CL_1 to CL_i is controlled by, for example, a driver circuit including a decoder.

The voltage of the gate lines BGL_1 to BGL_i is controlled by, for example, a gate line driver circuit.

The gate line driver circuit is formed using a circuit which includes a diode and a capacitor whose first capacitor electrode is electrically connected to an anode of the diode and the gate line BGL, for example.

By adjustment of the voltage of the second gate electrode of the transistor 1181, the threshold voltage of the transistor 1181 can be adjusted. Accordingly, by adjustment of the threshold voltage of the transistor 1181 functioning as a selection transistor, current flowing between the source electrode and the drain electrode of the transistor 1181 in an off state can be extremely small. Thus, a data holding period in the memory circuit can be longer. In addition, voltage necessary for writing and reading data can be made lower than that of a conventional semiconductor device; thus, power consumption can be reduced.

Embodiment 9

In this embodiment, examples of a semiconductor device using the transistor described in any of the above embodiments will be described with reference to FIGS. 13A and 13B.

Figure 13A:
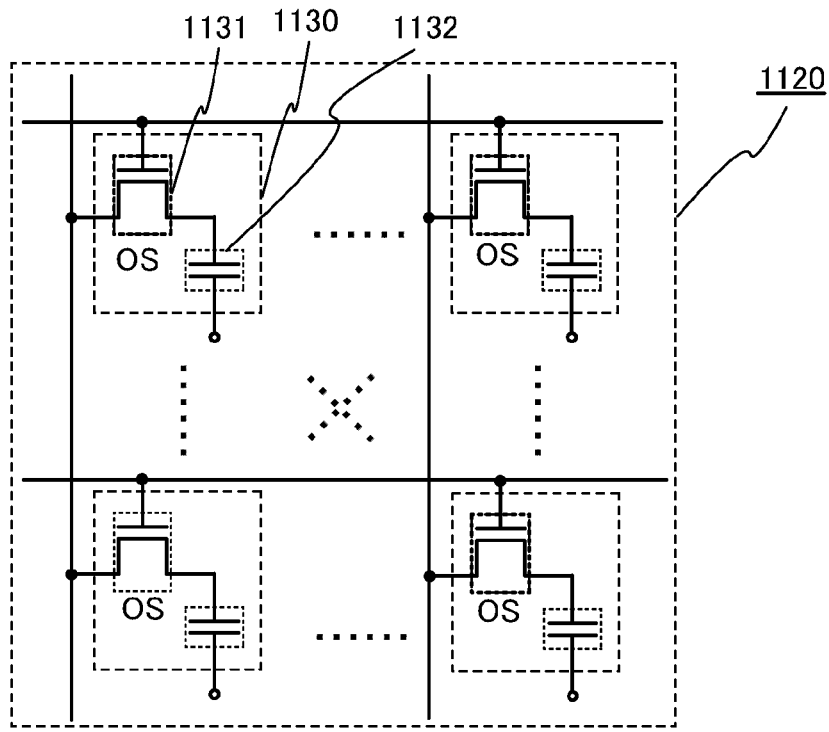
FIGS. 13A and 13B are examples of a circuit diagram illustrating an embodiment of the present invention.

FIG. 13A illustrates an example of a semiconductor device whose structure corresponds to that of a so-called dynamic random access memory (DRAM). A memory cell array 1120 illustrated in FIG. 13A has a structure in which a plurality of memory cells 1130 are arranged in a matrix. Further, the memory cell array 1120 includes m first wirings and n second wirings. Note that in this embodiment, the first wiring and the second wiring are referred to as a bit line BL and a word line WL, respectively.

The memory cell 1130 includes a transistor 1131 and a capacitor 1132. A gate electrode of the transistor 1131 is connected to the first wiring (the word line WL). Further, one of a source electrode and a drain electrode of the transistor 1131 is connected to the second wiring (the bit line BL). The other of the source electrode and the drain electrode of the transistor 1131 is connected to one electrode of the capacitor. The other electrode of the capacitor is connected to a capacitor line CL and is supplied with a predetermined potential. The transistor described in any of the above embodiments is applied to the transistor 1131.

The transistor in which a channel formation region is formed using an oxide semiconductor, which is described in any of the above embodiments, is characterized by having smaller off-state current than a transistor in which a channel formation region is formed using single crystal silicon. Accordingly, when the transistor is applied to the semiconductor device illustrated in FIG. 13A, which is regarded as a so-called DRAM, a substantially nonvolatile memory can be obtained.

Figure 13B:
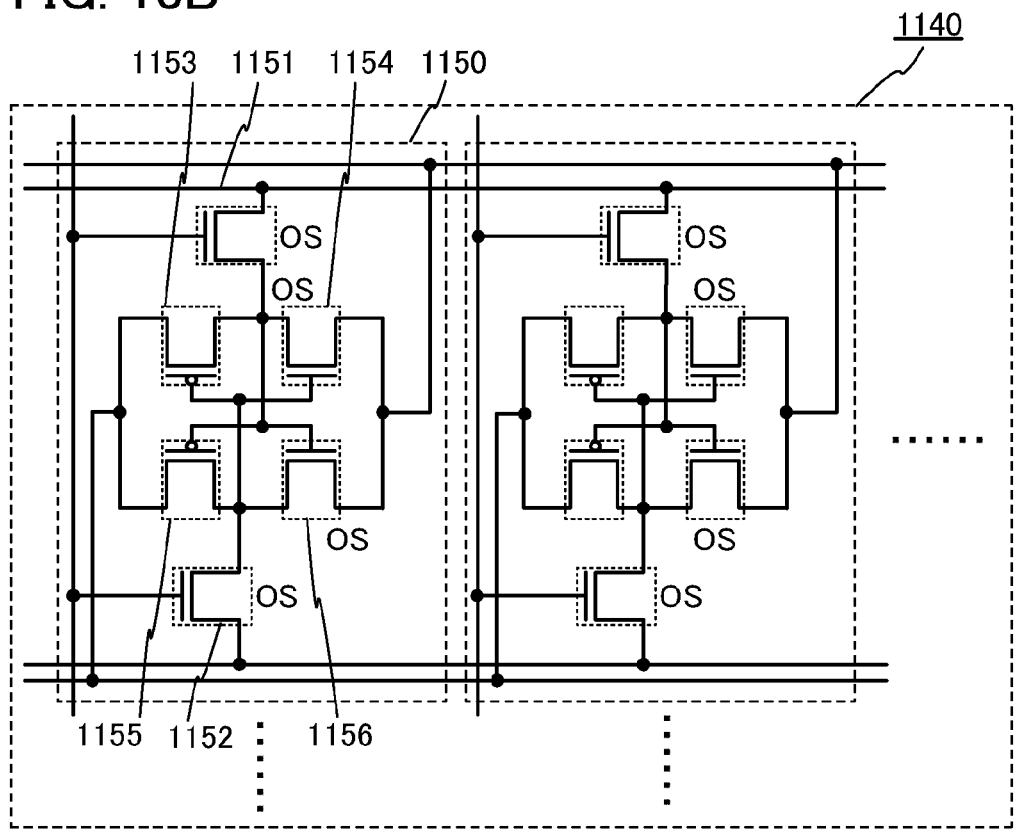

FIG. 13B illustrates an example of a semiconductor device whose structure corresponds to that of a so-called static random access memory (SRAM). A memory cell array 1140 illustrated in FIG. 13B can have a structure in which a plurality of memory cells 1150 are arranged in a matrix. Further, the memory cell array 1140 includes a plurality of first wirings (word lines WL), a plurality of second wirings (bit lines BL), and a plurality of third wirings (inverted bit lines /BL).

The memory cell 1150 includes a first transistor 1151, a second transistor 1152, a third transistor 1153, a fourth transistor 1154, a fifth transistor 1155, and a sixth transistor 1156. The first transistor 1151 and the second transistor 1152 function as selection transistors. One of the third transistor 1153 and the fourth transistor 1154 is an n-channel transistor (here, the fourth transistor 1154 is an n-channel transistor), and the other of the third transistor 1153 and the fourth transistor 1154 is a p-channel transistor (here, the third transistor 1153 is a p-channel transistor). In other words, the third transistor 1153 and the fourth transistor 1154 form a CMOS circuit. Similarly, the fifth transistor 1155 and the sixth transistor 1156 form a CMOS circuit.

The first transistor 1151, the second transistor 1152, the fourth transistor 1154, and the sixth transistor 1156 are n-channel transistors and the transistor described in any of the above embodiments can be applied to these transistors. Each of the third transistor 1153 and the fifth transistor 1155 is a p-channel transistor in which a channel formation region is formed using a material other than an oxide semiconductor (e.g., single crystal silicon).

The structures, methods, and the like described in this embodiment can be combined with the structures, methods, and the like described in any of the other embodiments as appropriate.

Embodiment 10

A central processing unit (CPU) can be formed using a transistor in which a channel formation region is formed using an oxide semiconductor for at least part thereof.

Figure 14A:
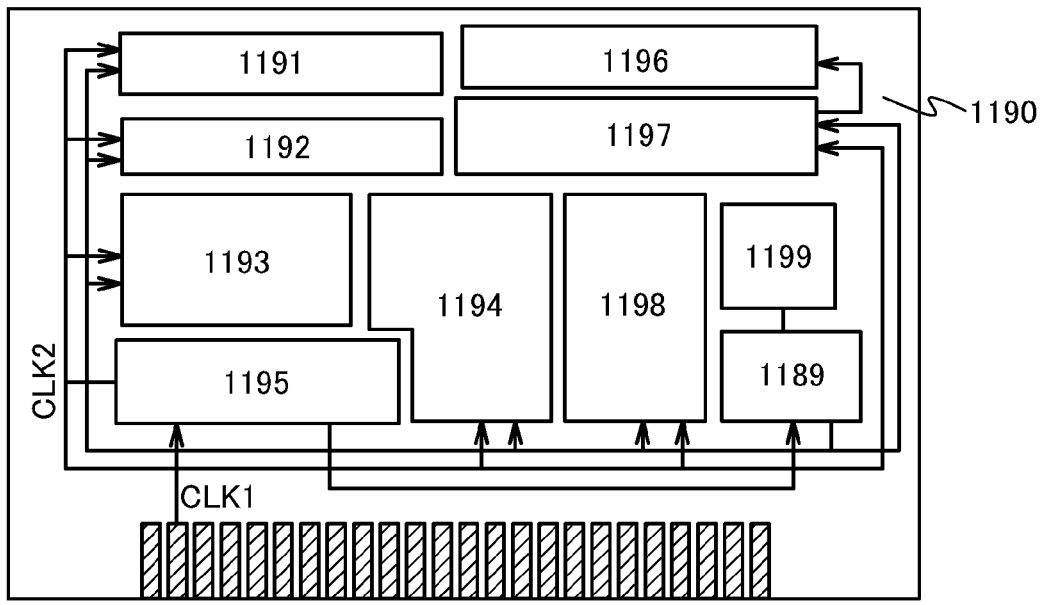
FIGS. 14A to 14C are a block diagram illustrating a specific example of a CPU and circuit diagrams each illustrating part of the CPU.

FIG. 14A is a block diagram illustrating a specific structure of a CPU. The CPU illustrated in FIG. 14A includes an arithmetic logic unit (ALU) 1191, an ALU controller 1192, an instruction decoder 1193, an interrupt controller 1194, a timing controller 1195, a register 1196, a register controller 1197, a bus interface (Bus I/F) 1198, a rewritable ROM 1199, and an ROM interface (ROM I/F) 1189 over a substrate 1190. A semiconductor substrate, an SOI substrate, a glass substrate, or the like is used as the substrate 1190. The ROM 1199 and the ROM interface 1189 may be provided over a separate chip. Obviously, the CPU illustrated in FIG. 14A is only an example in which the structure is simplified, and an actual CPU may have various structures depending on the application.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 on the basis of a reference clock signal CLK1, and supplies the clock signal CLK2 to the above circuits.

In the CPU illustrated in FIG. 14A, a memory element is provided in the register 1196. The memory element described in Embodiment 7 can be used as the memory element provided in the register 1196.

In the CPU illustrated in FIG. 14A, the register controller 1197 selects an operation of holding data in the register 1196 in accordance with an instruction from the ALU 1191. That is, the register controller 1197 selects whether data is held by a phase-inversion element or a capacitor in the memory element included in the register 1196. When data holding by the phase-inversion element is selected, power supply voltage is supplied to the memory element in the register 1196. When data holding by the capacitor is selected, the data is rewritten in the capacitor, and supply of power supply voltage to the memory element in the register 1196 can be stopped.

Figure 14B:
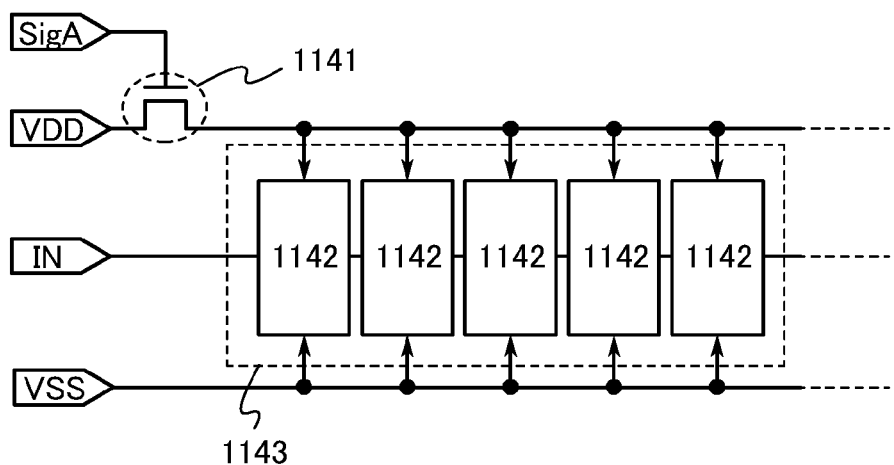
Figure 14C:
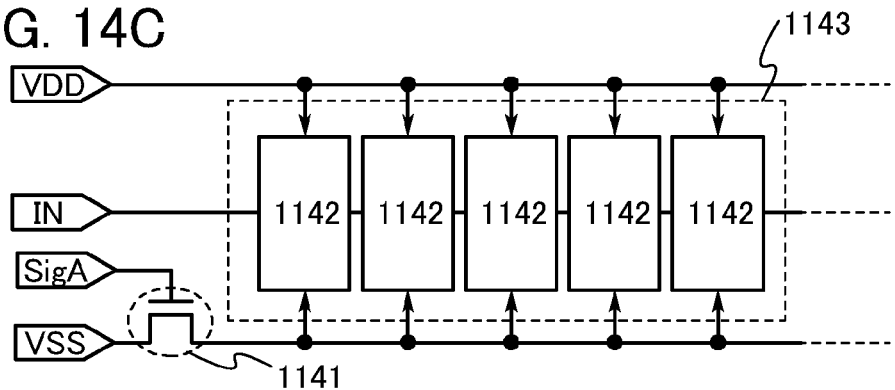

The power supply can be stopped by providing a switching element between a memory element group and a node to which a power supply potential VDD or a power supply potential VSS is supplied, as illustrated in FIG. 14B or FIG. 14C. Circuits illustrated in FIGS. 14B and 14C are described below.

FIGS. 14B and 14C each illustrate an example of a structure of a memory circuit including a transistor in which a channel formation region is formed using an oxide semiconductor as a switching element for controlling supply of a power supply potential to a memory element.

The memory device illustrated in FIG. 14B includes a switching element 1141 and a memory element group 1143 including a plurality of memory elements 1142. Specifically, as each of the memory elements 1142, the memory element described in Embodiment 7 can be used. Each of the memory elements 1142 included in the memory element group 1143 is supplied with the high-level power supply potential VDD via the switching element 1141. Further, each of the memory elements 1142 included in the memory element group 1143 is supplied with a potential of a signal IN and the low-level power supply potential VSS.

In FIG. 14B, a transistor in which a channel formation region is formed using an oxide semiconductor is used for the switching element 1141, and the switching of the transistor is controlled by a signal Sig A supplied to a gate electrode thereof.

Note that FIG. 14B illustrates the structure in which the switching element 1141 includes only one transistor; however, without limitation thereto, the switching element 1141 may include a plurality of transistors. In the case where the switching element 1141 includes a plurality of transistors which serve as switching elements, the plurality of transistors may be connected to each other in parallel, in series, or in combination of parallel connection and series connection.

Although the switching element 1141 controls the supply of the high-level power supply potential VDD to each of the memory elements 1142 included in the memory element group 1143 in FIG. 14B, the switching element 1141 may control the supply of the low-level power supply potential VSS.

In FIG. 14C, an example of a memory device in which each of the memory elements 1142 included in the memory element group 1143 is supplied with the low-level power supply potential VSS via the switching element 1141 is illustrated. The supply of the low-level power supply potential VSS to each of the memory elements 1142 included in the memory element group 1143 can be controlled by the switching element 1141.

Data can be held even in the case where a switching element is provided between a memory element group and a node to which the power supply potential VDD or the power supply potential VSS is supplied, an operation of a CPU is temporarily stopped, and the supply of the power supply voltage is stopped; accordingly, power consumption can be reduced. Specifically, for example, while a user of a personal computer does not input data to an input device such as a keyboard, the operation of the CPU can be stopped, so that the power consumption can be reduced.

Although the CPU is given as an example, the transistor can also be applied to an LSI such as a digital signal processor (DSP), a custom LSI, or a field programmable gate array (FPGA).

This embodiment can be implemented by being combined with any of the above embodiments as appropriate.

This application is based on Japanese Patent Application serial no. 2010-292404 filed with Japan Patent Office on Dec. 28, 2010, the entire contents of which are hereby incorporated by reference.

What is claimed is:

1. A method for manufacturing a semiconductor device, comprising the steps of:
    forming an oxide semiconductor film over an insulating surface;
    performing heat treatment on the oxide semiconductor film, wherein the heated oxide semiconductor film comprises a crystalline region whose c-axis is aligned in a direction perpendicular to a surface of the oxide semiconductor film;
    forming a gate insulating film covering a side surface of the oxide semiconductor film;
    forming a gate electrode over the gate insulating film; and
    forming a first oxide semiconductor region and a pair of second oxide semiconductor regions with the first oxide semiconductor region therebetween in the oxide semiconductor film, wherein the pair of second oxide semiconductor regions are formed by adding ions to the oxide semiconductor film with a mask that is the gate electrode.

2. The method for manufacturing the semiconductor device according to claim 1,
    wherein the pair of second oxide semiconductor regions are a source region and a drain region, and
    wherein the first oxide semiconductor region is a channel region.

3. The method for manufacturing the semiconductor device according to claim 1, wherein the oxide semiconductor film comprises at least two elements selected from the group of consisting of In, Ga, Sn, and Zn.

4. The method for manufacturing the semiconductor device according to claim 1, wherein each of the ions is one element selected from the group consisting of rare gas elements, and hydrogen.

5. The method for manufacturing the semiconductor device according to claim 4, wherein a concentration of the ions in the pair of second oxide semiconductor regions is higher than or equal to $5 \times 10^{18}$ atoms/cm$^3$ and lower than or equal to $1 \times 10^{22}$ atoms/cm$^3$.

6. The method for manufacturing the semiconductor device according to claim 1, wherein the gate electrode overlaps with the first oxide semiconductor region and does not overlap with the pair of second oxide semiconductor regions.

7. The method for manufacturing the semiconductor device according to claim 1, wherein the oxide semiconductor film comprises an In—Ga—Zn—O-based oxide semiconductor.

8. The method for manufacturing the semiconductor device according to claim 1, wherein the oxide semiconductor film is a non-single-crystal.

9. A method for manufacturing a semiconductor device, comprising the steps of:
    forming an oxide semiconductor film;
    performing heat treatment on the oxide semiconductor film, wherein the heated oxide semiconductor film comprises a crystalline region whose c-axis is aligned in a direction perpendicular to a surface of the oxide semiconductor film;
    forming a gate insulating film covering a side surface of the oxide semiconductor film,
    forming a first oxide semiconductor region and a pair of second oxide semiconductor regions with the first oxide semiconductor region therebetween in the oxide semiconductor film, wherein the pair of second oxide semiconductor regions are formed by adding ions to the oxide semiconductor film with a mask.

10. The method for manufacturing the semiconductor device according to claim 9,
    wherein the pair of second oxide semiconductor regions are a source region and a drain region, and
    wherein the first oxide semiconductor region is a channel region.

11. The method for manufacturing the semiconductor device according to claim 9, wherein the oxide semiconductor film comprises at least two elements selected from the group of consisting of In, Ga, Sn, and Zn.

12. The method for manufacturing the semiconductor device according to claim 9, wherein each of the ions is one element selected from the group consisting of rare gas elements.

13. The method for manufacturing the semiconductor device according to claim 12, wherein a concentration of the ions in the pair of second oxide semiconductor regions is higher than or equal to $5 \times 10^{18}$ atoms/cm$^3$ and lower than or equal to $1 \times 10^{22}$ atoms/cm$^3$.

14. The method for manufacturing the semiconductor device according to claim 9, further comprising the step of:
    forming a source electrode and a drain electrode over the oxide semiconductor film.

15. The method for manufacturing the semiconductor device according to claim 9, further comprising the step of:
    forming a gate electrode over the gate insulating film,
    wherein rare gas ions are added to the oxide semiconductor film with the mask that is the gate electrode through the gate insulating film.

16. The method for manufacturing the semiconductor device according to claim 9, wherein the oxide semiconductor film comprises an In—Ga—Zn—O-based oxide semiconductor.

17. The method for manufacturing the semiconductor device according to claim 9, wherein the oxide semiconductor film is a non-single-crystal.

18. The method for manufacturing the semiconductor device according to claim 1, wherein rare gas ions are added to the oxide semiconductor film through the gate insulating film.

* * * * *